(12) United States Patent
Cho et al.

(10) Patent No.: US 10,854,672 B2
(45) Date of Patent: Dec. 1, 2020

(54) DISPLAY DEVICE

(71) Applicant: SAMSUNG DISPLAY CO., LTD., Yongin-si (KR)

(72) Inventors: Hyunmin Cho, Seoul (KR); Yonghan Park, Hwaseong-si (KR); Sungchul Kim, Seongnam-si (KR); Hyeyong Chu, Hwaseong-si (KR); Daehyun Kim, Hwaseong-si (KR); Keunkyu Song, Seongnam-si (KR); Jooyeol Lee, Seoul (KR); Bekhyun Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/219,707

(22) Filed: Dec. 13, 2018

(65) Prior Publication Data
US 2019/0305035 A1     Oct. 3, 2019

(30) Foreign Application Priority Data
Mar. 30, 2018 (KR) .................. 10-2018-0037528

(51) Int. Cl.
*H01L 27/15* (2006.01)
*H01L 27/32* (2006.01)
(Continued)

(52) U.S. Cl.
CPC .......... *H01L 27/156* (2013.01); *G09G 3/32* (2013.01); *H01L 27/3276* (2013.01); (Continued)

(58) Field of Classification Search
CPC ... H01L 23/60; H01L 23/46; H01L 27/14629; H01L 27/156; H01L 27/153; H01L 33/58;
(Continued)

(56) References Cited

U.S. PATENT DOCUMENTS 8,872,214 B2   10/2014  Negishi et al.
8,895,955 B2   11/2014  Kim et al.
(Continued)

FOREIGN PATENT DOCUMENTS

JP           4912454 B2    4/2012
KR   10-2012-0138805 A   12/2012
(Continued)

*Primary Examiner* — Thanhha S Pham
(74) *Attorney, Agent, or Firm* — Lewis Roca Rothgerber Christie LLP

(57) ABSTRACT

A display device is capable of improving luminous efficiency and display quality and includes: a substrate; a thin film transistor on the substrate; a first electrode on the substrate and connected to the thin film transistor; a second electrode on the substrate and spaced apart from the first electrode; a plurality of light emitting elements between the first and second electrodes and electrically connected to each of the first and second electrodes; an insulating layer on the plurality of light emitting elements; and a reflective layer on the insulating layer. Each of the plurality of light emitting elements includes: a first semiconductor layer, an active layer on the first semiconductor layer, and a second semiconductor layer on the active layer.

24 Claims, 12 Drawing Sheets

(51) Int. Cl.
*H01L 33/58* (2010.01)
*H01L 33/32* (2010.01)
*H01L 33/50* (2010.01)
*H01L 33/40* (2010.01)
*H01L 33/46* (2010.01)
*G09G 3/32* (2016.01)

(52) U.S. Cl.
CPC ............ *H01L 33/325* (2013.01); *H01L 33/40* (2013.01); *H01L 33/46* (2013.01); *H01L 33/502* (2013.01); *H01L 33/58* (2013.01); *G09G 2310/08* (2013.01); *G09G 2320/0233* (2013.01); *H01L 27/3262* (2013.01); *H01L 27/3265* (2013.01)

(58) Field of Classification Search
CPC ................ H01L 33/54; H01L 27/3276; H01L 27/3288; H01L 27/3262; G09G 3/32; G09G 2320/0233
See application file for complete search history.

(56) References Cited

U.S. PATENT DOCUMENTS

| | | | |
|---|---|---|---|
| 9,112,112 | B2 | 8/2015 | Do et al. |
| 9,190,590 | B2 | 11/2015 | Shibata et al. |
| 9,329,433 | B2 | 5/2016 | Negishi et al. |
| 9,773,761 | B2 | 9/2017 | Do |
| 2011/0089850 | A1 | 4/2011 | Shibata et al. |
| 2017/0062674 | A1* | 3/2017 | Kwon ................... H01L 27/15 |
| 2017/0162553 | A1* | 6/2017 | Bibl ................. G02F 1/133603 |

FOREIGN PATENT DOCUMENTS

| | | |
|---|---|---|
| KR | 10-1244926 B1 | 3/2013 |
| KR | 10-1490758 | 2/2015 |
| KR | 10-1496151 B1 | 2/2015 |
| KR | 10-2015-0098246 A | 8/2015 |

\* cited by examiner

DISPLAY DEVICE

CROSS-REFERENCE TO RELATED APPLICATION

This application claims priority to and the benefit of Korean Patent Application No. 10-2018-0037528, filed on Mar. 30, 2018 in the Korean Intellectual Property Office, the entire disclosure of which is incorporated by reference herein.

BACKGROUND

1. Field

Aspects of embodiments of the present invention relate to a display device.

2. Discussion of Related Art

Display devices display images using an element that emits light. Such display devices may be classified into liquid crystal display ("LCD") devices, organic light emitting diode ("OLED") display devices, plasma display panel ("PDP") devices, electrophoretic display devices, and the like based on a light emitting scheme thereof.

In recent years, display devices including significantly small light emitting elements of a nanometer or micrometer size have been researched and developed. Such significantly small light emitting elements are a semiconductor element having a structure in which an n-type semiconductor crystal and a p-type semiconductor crystal are bonded to each other, and emitting light by converting electrical signals into light having a wavelength range of a desired area.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention may be directed to a display device including a significantly small light emitting element of a nanometer or micrometer size, thereby capable of improving luminous efficiency and display quality.

According to one or more embodiments, a display device includes: a substrate; a thin film transistor on the substrate; a first electrode on the substrate and connected to the thin film transistor; a second electrode on the substrate and spaced apart from the first electrode; a plurality of light emitting elements between the first and second electrodes and electrically connected to each of the first and second electrodes; an insulating layer on the plurality of light emitting elements; and a reflective layer on the insulating layer. Each of the plurality of light emitting elements includes: a first semiconductor layer, an active layer on the first semiconductor layer, and a second semiconductor layer on the active layer.

The insulating layer and the reflective layer may cover the first electrode, the second electrode, and the light emitting element.

Opposite ends of the reflective layer may have inclined surfaces, and the inclined surfaces may be located opposing each other in a direction of a major axis of the light emitting element.

The display device may further include a plurality of pixels on the substrate. The reflective layer may cover a plurality of pixels that are arranged along a direction.

The display device may further include a plurality of pixels on the substrate. The reflective layer may have an island shape covering each respective one of the plurailty of pixels.

The first and second electrodes may be on a substantilly same layer, and the second electrode may include two second electrodes spaced apart from each other with the first electrode therebetween.

Each of the first and second electrodes may include at least one of indium tin oxide (ITO), indium zinc oxide (IZO), zinc oxide (ZnO), and indium tin zinc oxide (ITZO).

The display device may further include a first contact electrode on the light emitting element and the second electrode, the first contact electrode directly contacting the light emitting element and the second electrode; and a second contact electrode on the first electrode and the light emitting element, the second contact electrode directly contacting the first electrode and the light emitting element.

The display device may further include a first insulating layer on the light emitting element. The first insulating layer may not overlap the first and second electrodes.

The display device may further include a second insulating layer on the light emitting element and the second electrode. The second insulating layer may not overlap the first electrode.

The light emitting element may have a cylindrical shape, and a diameter of the light emitting element may be from about 100 nm to about 1 μm.

The display device may further include light scattering particles in the insulating layer. The light scattering particles may have a refractive index different from a refractive index of the insulating layer.

The reflective layer may have a concavo-convex pattern.

The substrate may include a light guide area and a light emission area. The first and second electrodes may be arranged at the light guide area of the substrate. A light emitted from the light emitting element may be emitted through the light emission area of the substrate.

Each of the first and second electrodes may include at least one of Ag, Mg, Al, Pt, Pd, Au, Ni, Nd, Ir, Cr, Li, Ca, LiF/Ca, LiF/Al, Mo, Ti, and Cu.

The display device may further include a polarizing layer arranged apart from the light emitting element with the substrate therebetween.

The display device may further include a color conversion layer between the substrate and the polarizing layer.

According to one or more embodiments, a display device includes: a substrate; a thin film transistor on the substrate; a first electrode on the substrate and connected to the thin film transistor; a second electrode on the substrate and spaced apart from the first electrode; a plurality of light emitting elements between the first and second electrodes and electrically connected to each of the first and second electrodes; an insulating layer on the plurality of light emitting elements; and light scattering particles in the insulating layer. Each of the plurality of light emitting elements includes a first semiconductor layer, an active layer on the first semiconductor layer, and a second semiconductor layer on the active layer.

Each of the first and second electrodes may include at least one of indium tin oxide (ITO), indium zinc oxide (IZO), zinc oxide (ZnO), and indium tin zinc oxide (ITZO).

The display device may further include a first contact electrode disposed on the light emitting element and the second electrode, the first contact electrode directly contacting the light emitting element and the second electrode; and a second contact electrode disposed on the first electrode and the light emitting element, the second contact electrode directly contacting the first electrode and the light emitting element.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present invention will become more apparent by describing in further detail some embodiments thereof with reference to the accompanying drawings, wherein.

DETAILED DESCRIPTION

Figure 1:
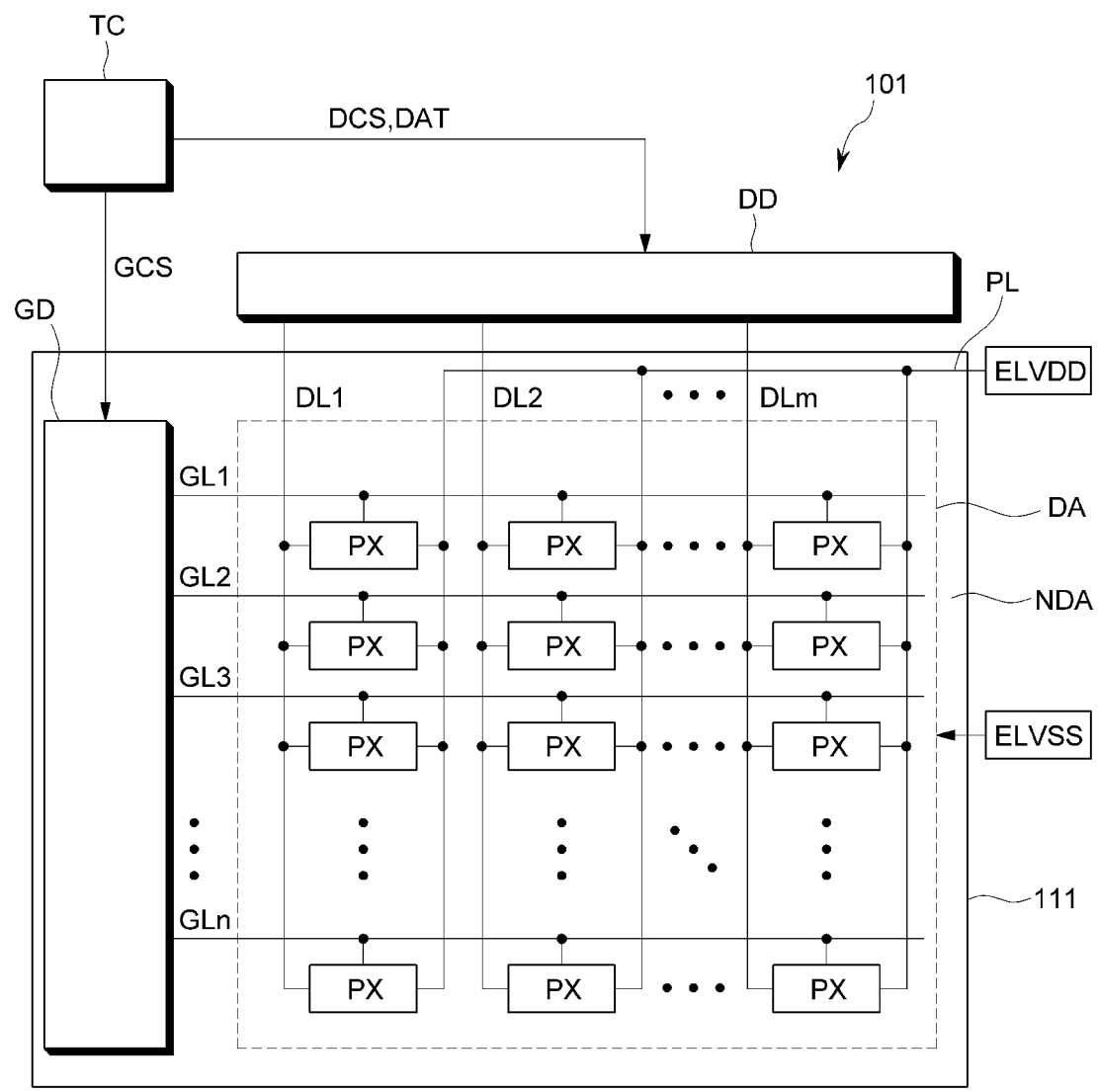
FIG. 1 is a block diagram illustrating a display device according to an embodiment of the present invention.

Some embodiments will now be described more fully herein with reference to the accompanying drawings. Although the invention may be modified in various manners and have several embodiments, some embodiments are illustrated in the accompanying drawings and will be mainly described in the specification. However, the scope of the invention is not limited to the described embodiments and should be construed as including all changes, equivalents, and substitutions included in the spirit and scope of the invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may not be present therebetween. Further, when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may not be present therebetween.

The spatially relative terms "below," "beneath," "lower," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in the case in which a device illustrated in the drawing is turned over, the device positioned "below" or "beneath" another device may be placed "above" another device. Accordingly, the illustrative term "below" may include both the lower and upper positions. The device may also be oriented in another direction, and, thus, the spatially relative terms may be interpreted differently depending on the orientations.

Throughout the specification, when an element is referred to as being "connected" to another element, the element may be "physically connected" to the other element, or "electrically connected" to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an idealized or excessively formal sense unless clearly defined in the present specification.

Description of some of the parts which are not associated with the present invention may not be provided in order to specifically describe embodiments of the present invention, and like reference numerals refer to like elements throughout the specification.

Herein, a display device according to an embodiment will be described with reference to FIGS. 1 to 8.

FIG. 1 is a block diagram illustrating a display device 101 according to an embodiment of the present invention.

Referring to FIG. 1, a display device 101 according to an embodiment of the present invention is divided into a display area DA and a non-display area NDA, and includes a timing controller TC, a gate driver GD, a data driver DD, and a plurality of pixels PX. As used herein, the pixel PX represents a minimum unit for displaying images, and the display device 101 displays images using a plurality of pixels PX. The display device may be classified into any of a top emission type, a bottom emission type, and a dual emission type according to the direction of light emission. For purposes of description herein, the display device 101 is assumed to be of the bottom emission type.

The timing controller TC receives an image data externally applied thereto and outputs a converted image data signal DAT to the data driver DD. In addition, the timing controller TC generates a gate driving control signal GCS and a data driving control signal DCS using horizontal and/or vertical synchronization signals and a clock signal, and output them to the gate driver GD and the data driver DD, respectively.

The gate driver GD receives the gate driving control signal GCS from the timing controller TC and generates a plurality of gate signals. The gate driving control signal GCS may include a vertical start signal for initiating the operation of the gate driver GD, a clock signal for determining the output timing of the signals, and the like. The gate driver GD sequentially outputs the plurality of gate signals to a plurality of gate lines GL1 to GLn.

The data driver DD receives the data driving control signal DCS and the converted image data signal DAT from the timing controller TC. The data driver DD generates a plurality of data signals based on the data driving control signal DCS and the converted image data signal DAT. The data signal is an analog voltage corresponding to the gray level value of the image data. The data driver DD outputs the plurality of data signals to a plurality of data lines DL1 to DLm.

The plurality of gate lines GL1 to GLn, the plurality of data lines DL1 to DLm insulated from and intersecting or crossing the plurality of gate lines GL1 to GLn, and a plurality of pixels PX connected to the plurality of data lines DL1 to DLm and the plurality of gate lines GL1 to GLn are located on a substrate 111 at the display area DA.

The plurality of gate lines GL1 to GLn and the plurality of data lines DL1 to DLm may extend along respective directions intersecting each other. The plurality of gate lines GL1 to GLn sequentially receive the gate signals from the gate driver GD, and the plurality of data lines DL1 to DLm receive the data signals from the data driver DD.

Each of the plurality of pixels PX is connected to a corresponding one of the plurality of gate lines GL1 to GLn, a corresponding one of the plurality of data lines DL1 to DLm, and a common power line PL. Each pixel PX is turned on in response to the corresponding gate signal and may receive a first power voltage ELVDD and a second power voltage ELVSS from the outside. Each pixel PX may receive the first power voltage ELVDD and the second power voltage ELVSS, and generate light in response to the corresponding data signal. The first power voltage ELVDD may have a voltage level higher than that of the second power voltage ELVSS.

Although the plurality of pixels PX according to an embodiment of the present invention is shown as being arranged in a matrix, embodiments are not limited thereto. In addition, the plurality of pixels PX may display various colors, and, for example, each pixel PX may emit one of red light, green light, blue light, and white light.

Figure 2:
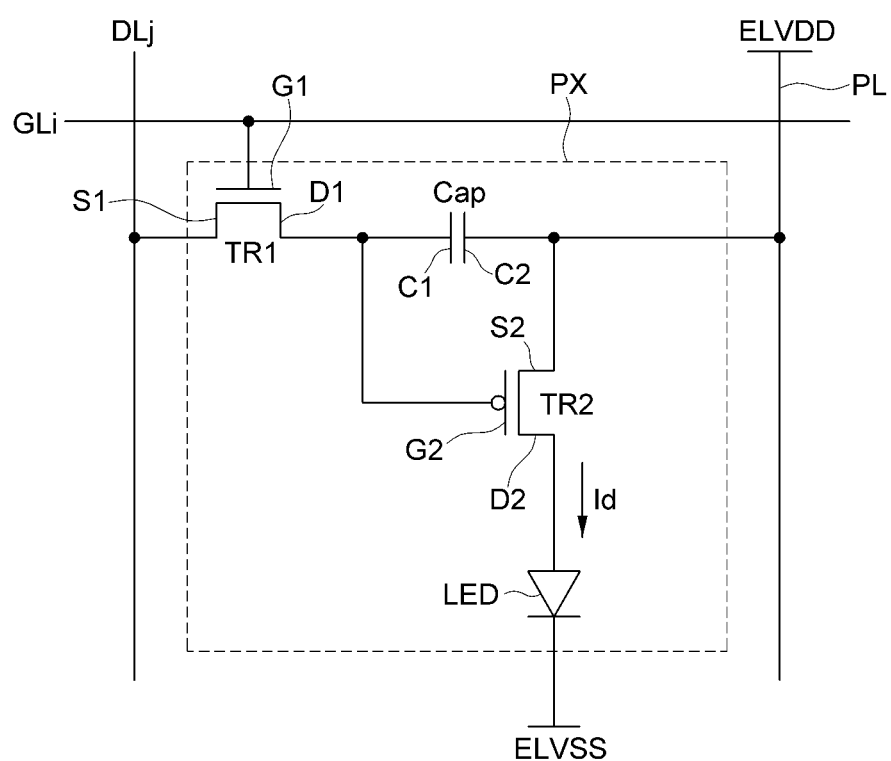
FIG. 2 is an equivalent circuit diagram illustrating a pixel of the display device shown in FIG. 1.

FIG. 2 is an equivalent circuit diagram illustrating a pixel of the display device shown in FIG. 1. Specifically, FIG. 2 is an equivalent circuit diagram illustrating a pixel connected to an i-th gate line GLi of the plurality of gate lines GL1 to GLn and a j-th data line DLj of the plurality of data lines DL1 to DLm.

Referring to FIG. 2, the pixel PX includes a first thin film transistor TR1, a second thin film transistor TR2, a capacitor Cap, and a light emitting element (herein, referred to as a light emitting diode ("LED")). That is, the display device 101 according to an embodiment of the present invention may be an active matrix type organic light emitting diode ("AMOLED") display device having a 2Tr-1Cap structure in which each pixel PX includes two transistors and one capacitor. However, embodiments are not limited thereto, and the display device 101 may include three or more transistors and two or more capacitors in each pixel and may have any of various structures including additional wirings.

In an embodiment, the first thin film transistor TR1 includes a first gate electrode G1 connected to the gate line GLi, a first source electrode S1 connected to the data line DLj, and a first drain electrode D1 connected to a second gate electrode G2 of the second thin film transistor TR2. The first thin film transistor TR1 serves as a switching element for selecting a pixel PX to emit light, and is also referred to as a switching thin film transistor. The first thin film transistor TR1 may output the data signal flowing through the data line DLj to the capacitor Cap and the second thin film transistor TR2 in response to the gate signal applied to the gate line GLi.

The capacitor Cap includes a first capacitor electrode C1 connected to the first thin film transistor TR1 and a second capacitor electrode C2 connected to the common power line PL to receive the first power voltage ELVDD. The capacitor Cap may store electric charges in the amount corresponding to a difference between the first power voltage ELVDD and a voltage corresponding to the data signal applied from the first thin film transistor TR1.

The second thin film transistor TR2 includes a second gate electrode G2 connected to the first drain electrode D1 of the first thin film transistor TR1 and the first capacitor electrode C1 of the capacitor Cap, a second source electrode S2 connected to the common power line PL to receive the first power voltage ELVDD, and a second drain electrode D2 connected to the LED. The second thin film transistor TR2 serves to apply the driving power for the LED to emit light to a first electrode 211 to be described below, and is also referred to as a driving thin film transistor.

The second thin film transistor TR2 may control a driving current Id flowing through the LED in accordance with the amount of electric charge stored in the capacitor Cap. A turn-on time of the second thin film transistor TR2 may be determined based on the amount of electric charges charged in the capacitor Cap. The second drain electrode D2 of the second thin film transistor TR2 may apply a voltage having a voltage level lower than that of the first power voltage ELVDD to the LED.

The LED is connected to the second thin film transistor TR2 and receives the second power voltage ELVSS. The LED may emit light during a turn-on period of the second thin film transistor TR2. The color of the light generated in the LED may be red, green, blue, or white. Further detailed descriptions of the LED will be provided below.

Figure 3:
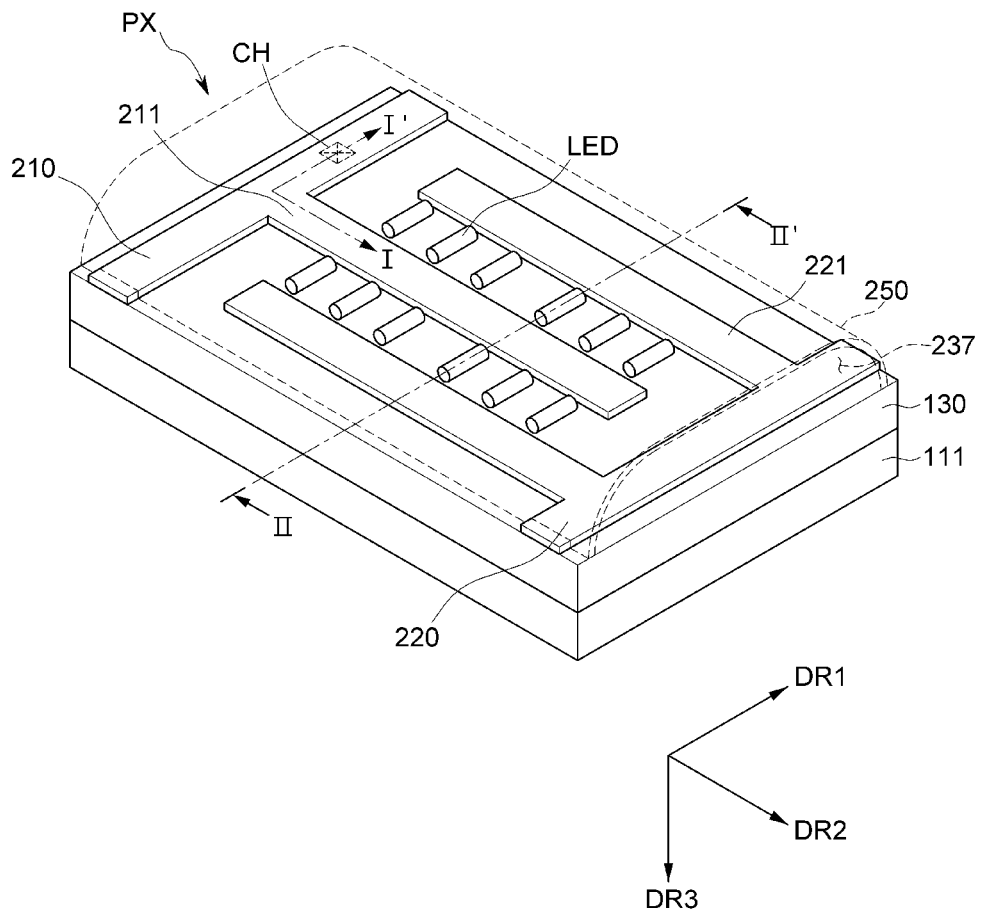
FIG. 3 is a perspective view schematically illustrating a pixel of the display device shown in FIG. 1.
Figure 4:
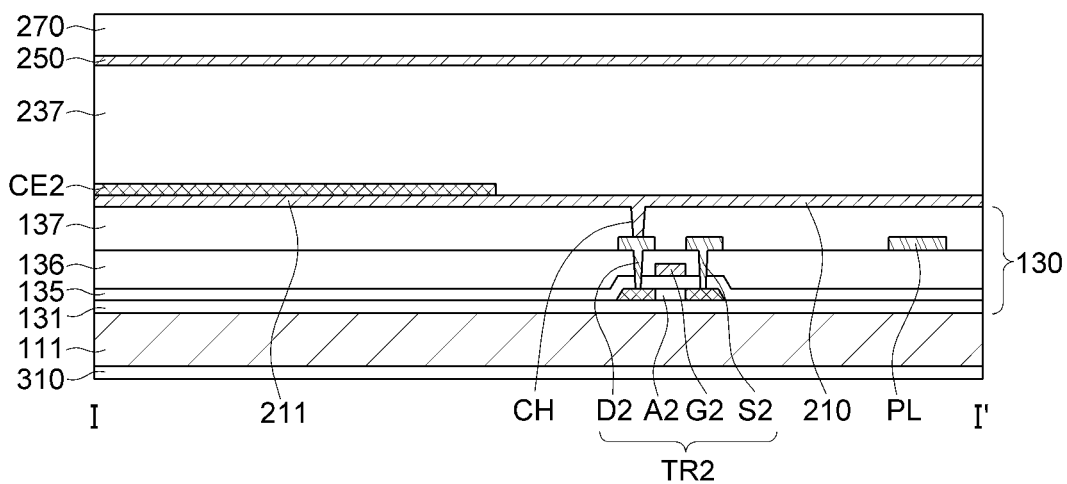
FIG. 4 is a cross-sectional view taken along the line I-I' of FIG. 3.
Figure 5:
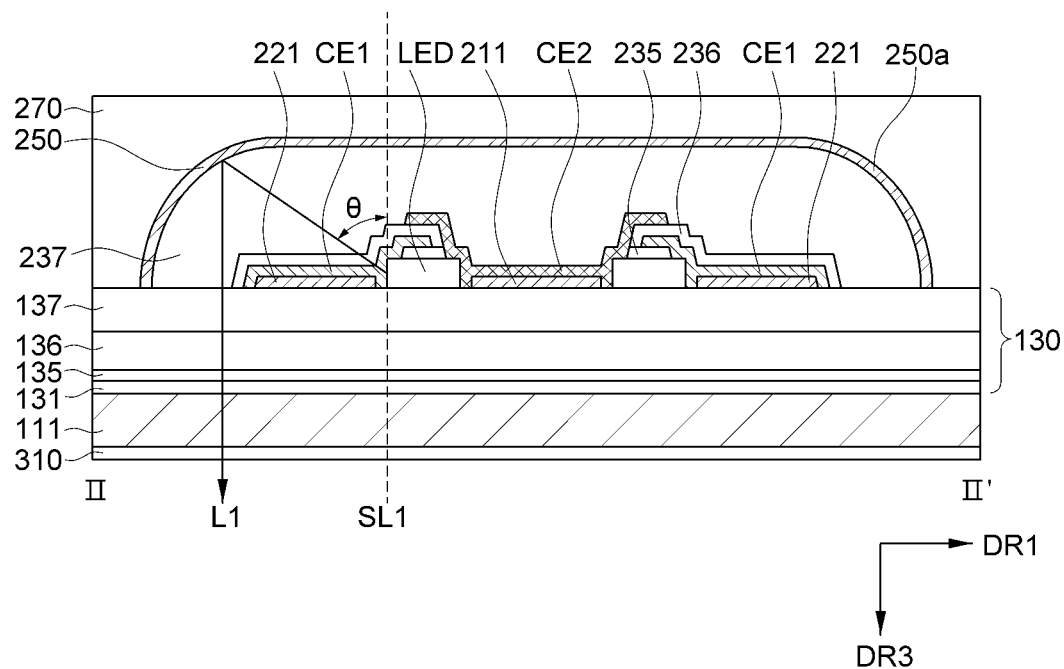
FIG. 5 is a cross-sectional view taken along the line II-II' of FIG. 3.
Figure 6:
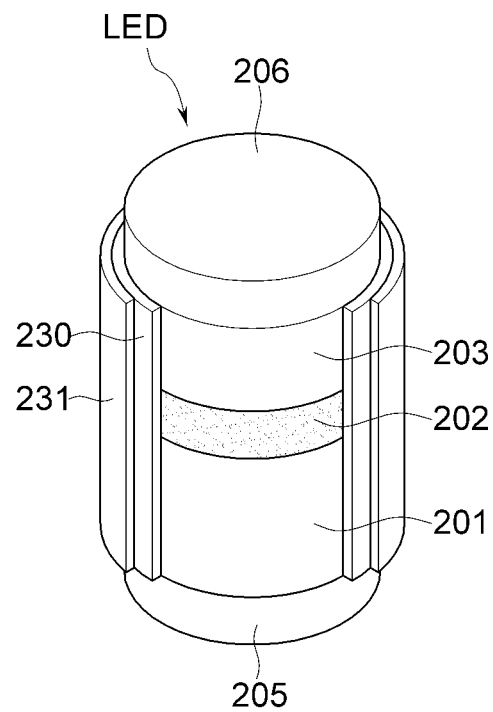
FIG. 6 is a perspective view illustrating a light emitting element.
Figure 7:
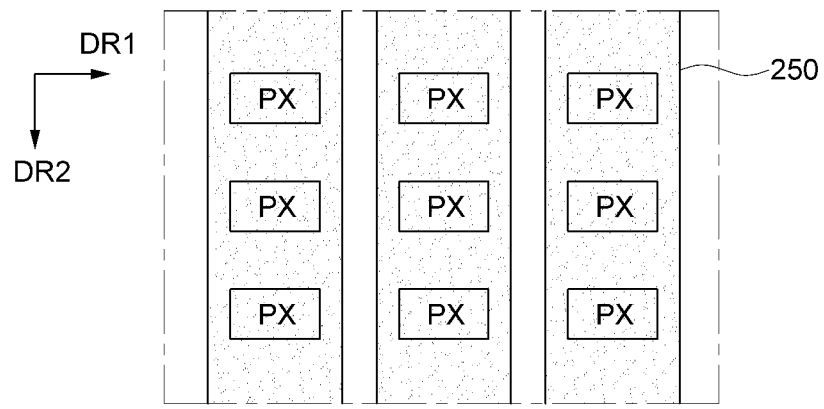
FIG. 7 is a plan view schematically illustrating a plurality of pixels and a reflective layer according to an embodiment of the present invention.
Figure 8:
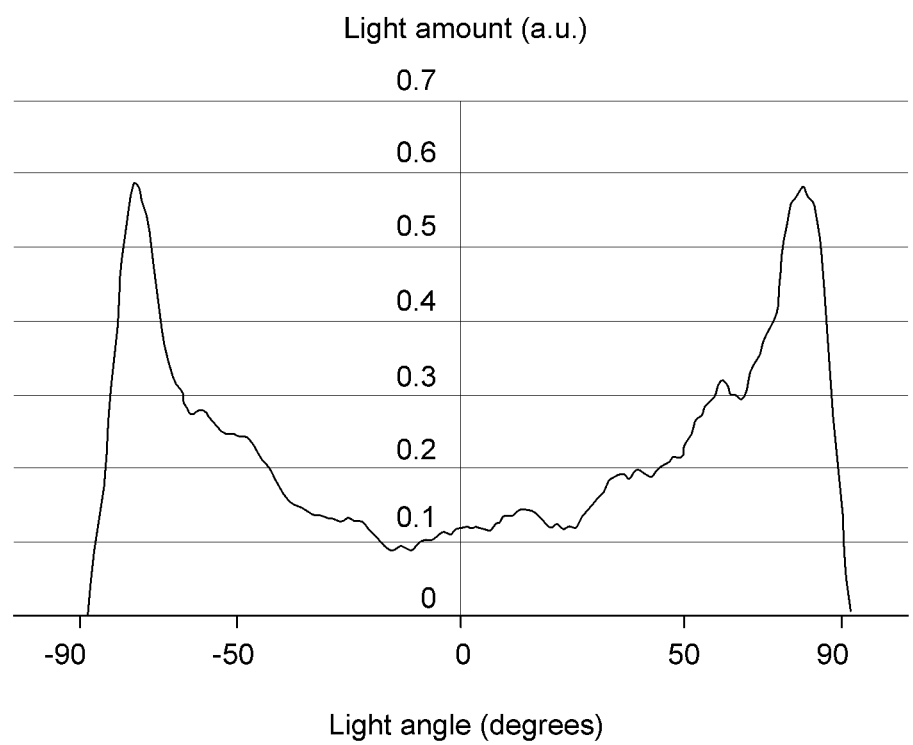
FIG. 8 is a graph schematically illustrating an amount of light emission of an LED according to an emission angle.

FIG. 3 is a perspective view schematically illustrating a pixel of the display device shown in FIG. 1; FIG. 4 is a cross-sectional view taken along the line I-I' of FIG. 3; FIG. 5 is a cross-sectional view taken along the line II-II' of FIG. 3; FIG. 6 is a perspective view illustrating a light emitting element; FIG. 7 is a plan view schematically illustrating a plurality of pixels and a reflective layer according to an embodiment of the present invention; and FIG. 8 is a graph schematically illustrating an amount of light emission of an LED according to an emission angle. Herein, for convenience of explanation, only some components are schematically shown in FIG. 3.

Referring to FIGS. 3, 4, and 5, a display device 101 according to an embodiment of the present invention includes a substrate 111, a driving circuit unit 130, a first electrode 211, a second electrode 221, an LED, a reflective layer 250, an encapsulation layer 270, and a polarizing layer 310.

In an embodiment, the substrate 111 may be a plastic film having flexibility. For example, the substrate 111 may include polyimide. However, embodiments are not limited thereto, and the substrate 111 may include an insulating material, such as glass or quartz. The substrate 111 may include a material selected from materials excellent in mechanical strength, thermal stability, transparency, surface smoothness, ease of handling, and water resistance.

The driving circuit unit 130 is disposed on the substrate 111. The driving circuit unit 130 corresponds to a part including a plurality of thin film transistors TR1 and TR2 and a capacitor Cap, and drives the LED.

For example, when the first thin film transistor TR1, the second thin film transistor TR2, the capacitor Cap, and the plurality of LEDs are provided for each pixel PX, a configuration including the first thin film transistor TR1, the second thin film transistor TR2, and the capacitor Cap is referred to as the driving circuit unit 130. The first thin film transistor TR1 may include a first gate electrode G1, a first source electrode S1, a first drain electrode D1, and a first active layer (not illustrated), and the second thin film transistor TR2 may include a second gate electrode G2, a second source electrode S2, a second drain electrode D2, and a second active layer A2.

In addition, a plurality of gate lines GL1 to GLn, a plurality of data lines DL1 to DLm, and a common power line PL are also disposed in the driving circuit unit 130. The LED emits light according to the driving signal received from the driving circuit unit 130 to display images.

In an embodiment, a buffer layer 131 is disposed on the substrate 111. The buffer layer 131 serves to substantially prevent permeation of undesirable elements and to planarize a surface therebelow and may include any of suitable materials for planarizing and/or substantially preventing permeation. In an embodiment, for example, the buffer layer 131 may include one of the following: a silicon nitride ($SiN_x$) layer, a silicon oxide ($SiO_2$) layer, and a silicon oxynitride ($SiO_xN_y$) layer. However, the buffer layer 131 is not invariably necessary and may be omitted based on the kind of the substrate 111 and process conditions thereof.

The first active layer (not illustrated) and the second active layer A2 are disposed on the buffer layer 131. In an embodiment, the first active layer (not illustrated) and the second active layer A2 may include amorphous silicon, polycrystalline silicon, or the like. In another embodiment, the first active layer (not illustrated) and the second active layer A2 may include an oxide semiconductor. In an embodiment, each of the first active layer (not illustrated) and the second active layer A2 may include a source area heavily doped with n-type impurities, a drain area heavily doped with p-type impurities, and a channel area disposed between the source and drain areas.

A gate insulating layer 135 is disposed on the first active layer (not illustrated) and the second active layer A2. In an embodiment, the gate insulating layer 135 may include any of silicon nitride ($SiN_x$), silicon oxide ($SiO_2$), and silicon oxynitride ($SiO_xN_y$).

The first gate electrode G1 and the second gate electrode G2 are disposed on the gate insulating layer 135. The first and second gate electrodes G1 and G2 are disposed so as to overlap the first active layer (not illustrated) and the second active layer A2, respectively. In particular, the first and second gate electrodes G1 and G2 may be disposed overlapping the channel areas of the first active layer (not illustrated) and the second active layer A2, respectively.

In addition, the plurality of gate lines GL1 to GLn and the first capacitor electrode C1 of the capacitor Cap are disposed on the gate insulating layer 135. In such an embodiment, the first capacitor electrode C1 may be formed unitarily with the second gate electrode G2.

An insulating interlayer 136 is disposed on the first and second gate electrodes G1 and G2, the plurality of gate lines GL1 to GLn, and the first capacitor electrode C1 of the capacitor Cap. In an embodiment, the insulating interlayer 136 may be an inorganic insulating layer or an organic insulating layer including any of silicon nitride ($SiN_x$), silicon oxide ($SiO_2$), and silicon oxynitride ($SiO_xN_y$).

The first source electrode S1, the second source electrode S2, the first drain electrode D1, and the second drain electrode D2 are disposed on the insulating interlayer 136. The first and second source electrodes S1 and S2 contact the source areas of the first active layer (not illustrated) and the second active layer A2 through contact holes defined in the gate insulating layer 135 and the insulating interlayer 136, respectively. In addition, the first and second drain electrodes D1 and D2 contact the drain areas of the first active layer (not illustrated) and the second active layer A2 through contact holes defined in the gate insulating layer 135 and the insulating interlayer 136, respectively.

In addition, the plurality of data lines DL1 to DLm and the common power line PL are disposed on the insulating interlayer 136. In such an embodiment, the plurality of data lines DL1 to DLm and the common power line PL extend along the direction intersecting the plurality of gate lines GL1 to GLn.

A planarization layer 137 is disposed on the first and second source electrodes S1 and S2, the first and second drain electrodes D1 and D2, and the common power line PL.

The planarization layer 137 serves to protect the driving circuit unit 130 and to flatten an upper surface of the driving circuit unit 130.

The planarization layer 137 may include an insulating material. In an embodiment, the planarization layer 137 may be an inorganic insulating layer or an organic insulating layer including any of silicon nitride (SiN$_x$), silicon oxide (SiO$_2$), and silicon oxynitride (SiO$_x$N$_y$). For example, the planarization layer 137 may include a photosensitive polymer resin.

A first wiring 210, a second wiring 220, a first electrode 211, and a second electrode 221 are disposed on the planarization layer 137. The first wiring 210 contacts the second drain electrode D2 through a contact hole CH defined in the planarization layer 137. That is, the first wiring 210 may receive the driving voltage through the second drain electrode D2.

The first and second wirings 210 and 220 are disposed on the substrate 111 extending along a first direction DR1. In an embodiment, the first and second wirings 210 and 220 may be disposed in parallel with the plurality of gate lines GL1 to GLn on a same plane. However, embodiments are not limited thereto, and the first and second wirings 210 and 220 may be disposed on different planes, and may be disposed to cross the plurality of gate lines GL1 to GLn.

The first and second wirings 210 and 220 may include a conductive material. For example, each of the first and second wirings 210 and 220 may include a conductive oxide, such as any of indium tin oxide (ITO), indium zinc oxide (IZO), zinc oxide (ZnO), and indium tin zinc oxide (ITZO), or a metal material including at least one of Ag, Mg, Al, Pt, Pd, Au, Ni, Nd, Ir, Cr, Li, Ca, Ti, and Cu. In an embodiment, each of the first and second wirings 210 and 220 may have a multi-layer structure in which a plurality of layers are stacked.

The first and second electrodes 211 and 221 are disposed between the first and second wirings 210 and 220. Each of the first and second electrodes 211 and 221 extends along a second direction DR2 which crosses the first direction DR1, and the first and second electrodes 211 and 221 may be disposed alternately with each other along the first direction DR1. Each pixel PX, according to an embodiment of the present invention, includes one first electrode 211 and two second electrodes 221 spaced apart from each other with the one first electrode 211 therebetween. However, embodiments are not limited thereto, and the number of the first electrodes 211 and the number of the second electrodes 221 may be variously changed.

The first electrode 211 is electrically connected to the first wiring 210, and the second electrode 221 is electrically connected to the second wiring 220. In an embodiment, the first electrode 211 may be formed unitarily with the first wiring 210, and the second electrode 221 may be formed unitarily with the second wiring 220. That is, the first electrode 211 may extend from the first wiring 210 toward the second wiring 220, and the second electrode 221 may extend from the second wiring 220 toward the first wiring 210. However, embodiments are not limited thereto, and the first electrode 211 may be disposed on a plane different from a plane on which the first wiring 210 is disposed, and may be electrically connected to the first wiring 210 through a separate connection electrode. Similarly, the second electrode 221 may be disposed on a plane different from a plane on which the second wiring 220 is disposed, and may be electrically connected to the second wiring 220 through a separate connection electrode.

The first and second electrodes 211 and 221 may include a conductive material. For example, each of the first and second electrodes 211 and 221 may include a transparent conductive material. For example, each of the first and second electrodes 211 and 221 may include a conductive oxide, such as indium tin oxide (ITO), indium zinc oxide (IZO), zinc oxide (ZnO), indium tin zinc oxide (ITZO).

A plurality of LEDs are disposed on the substrate 111 on which the first and second electrodes 211 and 221 are disposed. The LED is a semiconductor element which receives an electric signal and emits light of a specific wavelength range. In an embodiment, the plurality of LEDs may be aligned substantially perpendicular to the first and second electrodes 211 and 221. That is, the plurality of LEDs may be arranged such that a major axis of each LED is parallel to the first direction DR1. However, embodiments are not limited thereto, and some of the plurality of LEDs may be arranged such that the major axis thereof has an angle (e.g., a predetermined angle) with respect to the first direction DR1.

Each of the plurality of LEDs is electrically connected to the first and second electrodes 211 and 221. For example, the plurality of LEDs may be connected to the first and second electrodes 211 and 221 through contact electrodes CE1 and CE2 to be described below. However, embodiments are not limited thereto, and the plurality of LEDs may be disposed directly contacting and overlapping the first and second electrodes 211 and 221. In other words, although a distance between adjacent first and second electrodes 211 and 221 is shown to be larger than the length of each LED, embodiments are not limited thereto. In an embodiment, the distance between the adjacent first and second electrodes 211 and 221 may be less than or substantially equal to the length of each LED.

In an embodiment, the diameter of the LED may be in a range from about 100 nm to about 1 μm. For example, the diameter of the LED may be about 500 nm. When the diameter of the LED is less than about 100 nm, the luminous efficiency of each LED may be lowered. When the diameter of the LED exceeds 1 μm, the number of LEDs per unit area may decrease, and the overall luminous efficiency of the display device may be relatively lowered. In an embodiment, the length of the LED may be in a range from about 500 nm to about 10 μm, and the aspect ratio (diameter-length ratio) of the LED may be in a range from about 1:1.2 to about 1:10.0. The LED has a diameter of a nanometer size and a length of a nanometer or micrometer size, and such LEDs are also called a significantly small LED, a micro LED, or a nano-LED.

Referring to FIG. 6, the LED includes a first semiconductor layer 201, an active layer 202 disposed on the first semiconductor layer 201, and a second semiconductor layer 203 disposed on the active layer 202. In an embodiment, the LED has a rod shape and, in particular, a cylindrical shape. However, embodiments are not limited thereto, and the LED may have a polygonal prismatic shape, such as a triangular prism, a square prism, a hexagonal prism, or the like.

The first semiconductor layer 201 may be an n-type semiconductor layer. For example, the first semiconductor layer 201 may be formed by doping a semiconductor material, such as InAlGaN, GaN, AlGaN, InGaN, AlN, and InN, with a dopant, such as Si, Ge, or Sn. However, embodiments are not limited thereto, and the semiconductor material and the dopant of the first semiconductor layer 201 may be determined according to the emission color of the LED. In an embodiment, the thickness of the first semiconductor layer 201 may be in a range from about 500 nm to about 5 µm, but embodiments are not limited thereto.

The active layer 202 is disposed on the first semiconductor layer 201. The active layer 202 may have a single or multiple quantum well structure. When a voltage is applied to the LED, light is emitted by the electron-hole coupling in the active layer 202. For example, the active layer 202 may include a semiconductor material, such as AlGaN, AlInGaN, or the like. In an embodiment, the thickness of the active layer 202 may be in a range from about 10 nm to about 200 nm, but embodiments are not limited thereto.

The second semiconductor layer 203 is disposed on the active layer 202. The second semiconductor layer 203 may be a p-type semiconductor layer. For example, the second semiconductor layer 203 may be formed by doping a semiconductor material, such as InAlGaN, GaN, AlGaN, InGaN, AlN, and InN, with a dopant, such as Mg. However, embodiments are not limited thereto, and the semiconductor material and the dopant of the second semiconductor layer 203 may be determined according to the emission color of the LED. In an embodiment, the thickness of the second semiconductor layer 203 may be in a range from about 50 nm to about 500 nm, but embodiments are not limited thereto.

The LED may further include a clad layer (not illustrated) between the first semiconductor layer 201 and the active layer 202 or between the active layer 202 and the second semiconductor layer 203. The clad layer may be formed by doping a semiconductor material, such as AlGaN, InAlGaN, or the like, with a conductive dopant. As the LED further includes the clad layer, the luminous efficiency may be improved.

In addition, as illustrated in FIG. 6, the LED may further include a first electrode layer 205 disposed at a lower portion of the first semiconductor layer 201, and a second electrode layer 206 disposed at an upper portion of the second semiconductor layer 203. However, embodiments are not limited thereto, and the LED may include only one of the first electrode layer 205 and the second electrode layer 206.

In an embodiment, the first electrode layer 205 and the second electrode layer 206 may include a conductive oxide or a metal material used for a conventional electrode. For example, each of the first and second electrode layers 205 and 206 may include a conductive oxide, such as any of indium tin oxide (ITO), indium zinc oxide (IZO), zinc oxide (ZnO), and indium tin zinc oxide (ITZO), or a metal material including at least one of Ag, Mg, Al, Pt, Pd, Au, Ni, Nd, Ir, Cr, Li, Ca, Ti, and Cu. In an embodiment, the thickness of each of the first and second electrode layers 205 and 206 may be in a range from about 1 nm to about 100 nm, but embodiments are not limited thereto.

The first and second electrode layers 205 and 206 may serve as an ohmic contact layer. That is, since the LED includes the first and second electrode layers 205 and 206, a separate ohmic contact layer may not be formed at a portion where the LED is connected to the first and second electrodes 211 and 221 on the substrate 111.

In addition, as illustrated in FIG. 6, the LED may further include an insulating layer 230 and a hydrophobic film 231 that covers at least part of outer surfaces of the first semiconductor layer 201, the active layer 202, and the second semiconductor layer 203.

In an embodiment, the insulating layer 230 is disposed to cover at least part of the first and second semiconductor layers 201 and 203 and the entire outer surface of the active layer 202. For example, the insulating layer 230 may be disposed at a remaining portion except for a portion where the LED and the first and second electrodes 211 and 221 are electrically connected to each other.

When the LED is misaligned on the first and second electrodes 211 and 221, the active layer 202 of the LED is short-circuited with the first electrode 211 or the second electrode 221, and the LED may not emit light. Further, the active layer 202 may not be located in the center in the longitudinal direction of the LED, and the active layer 202 may be biased toward the first semiconductor layer 201 or the second semiconductor layer 203. In such a case, an electrical short circuit may easily occur between the active layer 202 and the first electrode 211, or between the active layer 202 and the second electrode 221. As such, by disposing the insulating layer 230 to cover the entire outer surface of the active layer 202, an electrical short circuit between the active layer 202 and the first electrode 211, or between the active layer 202 and the second electrode 221 may be substantially prevented. In addition, since the insulating layer 230 protects the first and second semiconductor layers 201 and 203 and the outer surface of the active layer 202, the durability of the LED may be improved, and degradation of the luminous efficiency of the LED due to physical damage may be substantially prevented.

In an embodiment, the insulating layer 230 may include silicon nitride ($SiN_x$), silicon oxide ($SiO_x$), silicon oxynitride ($SiO_xN_y$), aluminum oxide ($Al_2O_3$), hafnium oxide ($HfO_2$), yttrium oxide ($Y_2O_3$), titanium dioxide ($TiO_2$), or the like. In an embodiment, the insulating layer 230 may have a multi-layer structure including at least two insulating layers having different physical properties.

The hydrophobic film 231 is disposed on the insulating layer 230. The hydrophobic film 231 allows the surface of the LED to have a hydrophobic property, thereby substantially preventing aggregation between the plurality of LEDs. That is, when the plurality of LEDs are mixed with a solvent or are aligned by the applied voltage, the aggregation phenomenon between the plurality of LEDs may be substantially minimized, degradation in properties of each of the LEDs may be substantially prevented, and the plurality of LEDs may be more easily aligned between the first and second electrodes 211 and 221. However, embodiments are not limited thereto, and the LED may include a hydrophilic film in place of the hydrophobic film 231 according to process conditions.

In an embodiment, the hydrophobic film 231 may include a fluoropolymer, such as octadecyltrichlorosilane (OTS), fluoroalkyltrichlorosilane, perfluoroalkyl triethoxysilane, Teflon, and Cytop, which may be used solely or in combination, but embodiments are not limited thereto.

Referring again to FIG. 5, a first insulating layer 235 is disposed on the LED disposed between the first and second electrodes 211 and 221. The first insulating layer 235 according to an embodiment of the present invention does not overlap the first and second electrodes 211 and 221. For example, the first insulating layer 235 may be disposed only between the first and second electrodes 211 and 221. However, embodiments are not limited thereto, and, in an embodiment, the first insulating layer 235 may be disposed over the entire surface of the substrate 111 except for upper surfaces of the first and second electrodes 211 and 221.

In an embodiment, the first insulating layer 235 may include silicon nitride ($SiN_x$), silicon oxide ($SiO_x$), silicon oxynitride ($SiO_xN_y$), aluminum oxide ($Al_2O_3$), hafnium oxide ($HfO_2$), yttrium oxide ($Y_2O_3$), titanium dioxide ($TiO_2$), or the like. In an embodiment, the first insulating layer 235 may have a multi-layer structure including at least two insulating layers having different physical properties.

The first contact electrode CE1 is disposed on the first insulating layer 235, the LED, and the second electrode 221. The LED is connected to the second electrode 221 through the first contact electrode CE1. The LED may receive the second power voltage ELVSS through the second electrode 221 and the first contact electrode CE1.

The first contact electrode CE1 includes a conductive material. The first contact electrode CE1 may include a transparent conductive material. For example, the first contact electrode CE1 may include a conductive oxide, such as indium tin oxide (ITO), indium zinc oxide (IZO), zinc oxide (ZnO), or indium tin zinc oxide (ITZO).

In an embodiment, the first contact electrode CE1 may be disposed only on the upper surface of the second electrode 221 among the second wiring 220 and the second electrode 221 which are unitarily formed. However, embodiments are not limited thereto, and the first contact electrode CE1 may extend to the upper surface of the second wiring 220.

A second insulating layer 236 is disposed on the first contact electrode CE1. The second insulating layer 236 according to an embodiment of the present invention does not overlap the first electrode 211. That is, in an embodiment, the second insulating layer 236 does not contact the first electrode 211, and may be only disposed on the LED, the first insulating layer 235, the second electrode 221, and the first contact electrode CE1. However, embodiments are not limited thereto, and, in an embodiment, the second insulating layer 236 may be disposed over the entire surface of the substrate 111 except the upper portion of the first electrode 211.

In an embodiment, the second insulating layer 236 may include silicon nitride ($SiN_x$), silicon oxide ($SiO_x$), silicon oxynitride ($SiO_xN_y$), aluminum oxide ($Al_2O_3$), hafnium oxide ($HfO_2$), yttrium oxide ($Y_2O_3$), titanium dioxide ($TiO_2$), or the like. In an embodiment, the second insulating layer 236 may have a multi-layer structure including at least two insulating layers having different physical properties.

The second contact electrode CE2 is disposed on the second insulating layer 236, the LED, and the first electrode 211. The LED is connected to the first electrode 211 through the second contact electrode CE2. That is, the LED may receive the driving voltage through the first electrode 211 and the second contact electrode CE2.

For example, referring to FIGS. 5 and 6, one of the first and second electrode layers 205 and 206 of the LED may be connected to the first electrode 211 through the second contact electrode CE2, and receives the driving voltage applied through the first electrode 211 and the second contact electrode CE2. In addition, the other of the first and second electrode layers 205 and 206 of the LED is electrically connected to the second electrode 221 through the first contact electrode CE1, and receives the second power source voltage ELVSS through the second electrode 221 and the first contact electrode CE1. The LED receiving the driving voltage and the second power voltage ELVSS applied through the first and second electrode layers 205 and 206 emits light of a specific wavelength range by electron-hole coupling in the active layer 202.

In an embodiment, the second contact electrode CE2 may include a conductive oxide or a metal material used for a conventional electrode. For example, the first contact electrode CE1 may include a conductive oxide, such as any of indium tin oxide (ITO), indium zinc oxide (IZO), zinc oxide (ZnO), and indium tin zinc oxide (ITZO), or a metal material including at least one of Ag, Mg, Al, Pt, Pd, Au, Ni, Nd, Ir, Cr, Li, Ca, Ti, and Cu.

As illustrated in FIG. 4, in an embodiment, the second contact electrode CE2 may be disposed only on an upper surface of the first electrode 211 among the first wiring 210 and the first electrode 211 that are unitarily formed. However, embodiments are not limited thereto, and the second contact electrode CE2 may extend to the upper surface of the first wiring 210.

A third insulating layer 237 is disposed on the first and second electrodes 211 and 221, the plurality of LEDs, the first and second contact electrodes CE1 and CE2, and the first and second insulating layers 235 and 236. In such an embodiment, the third insulating layer 237 may be disposed to cover the plurality of pixels PX arranged in a row along the second direction DR2. For example, the third insulating layer 237 may have a shape of a plurality of lines that are not disposed between pixels PX adjacent to each other in the first direction DR1 and may extend along the second direction DR2 substantially perpendicular to the major axis of the LED.

The third insulating layer 237 includes a light transmitting material so as to efficiently guide light. For example, the third insulating layer 237 may include a polymer organic material. In an embodiment, the polymer organic material may include at least one of an acrylic resin, an epoxy resin, polyimide, and polyethylene. In an embodiment, the third insulating layer 237 may have a refractive index in a range from about 1.50 to about 2.50, but embodiments are not limited thereto.

The reflective layer 250 is disposed on the third insulating layer 237. The reflective layer 250 is disposed overlapping the first and second electrodes 211 and 221, the plurality of LEDs, the first and second contact electrodes CE1 and CE2 and the first, second, and third insulating layers 235, 236, and 237. In such an embodiment, the reflective layer 250 may be disposed to cover the plurality of pixels PX that are arranged in a row along the second direction DR2.

For example, referring to FIG. 7, the reflective layer 250 may have a shape of a plurality of lines that are not disposed between pixels PX adjacent to each other in the first direction DR1 and extend along the second direction DR2 substantially perpendicular to the major axis of the LED. In such an embodiment, the reflective layer 250 may have substantially the same shape as the surface of the third insulating layer 237 contacting the reflective layer 250. In other words, the reflective layer 250 may have substantially the same shape as the third insulating layer 237 on a plane.

One of the reflective layers 250 in the shape of a plurality of lines may be disposed overlapping the entirety of a plurality of pixels PX that are arranged in a row along the second direction DR2. In addition, one of the reflective layers 250 in the shape of a plurality of lines may be disposed overlapping some of the plurality of pixels PX that are arranged in a row along the second direction DR2. For example, one reflective layer 250 may be disposed overlapping two to four pixels PX that are arranged in a row along the second direction DR2.

The display device 101 according to an embodiment of the present invention is of a bottom emission type, and the light emitted from the LED is reflected by the reflective layer 250 and emitted to a back surface of the display device 101. In such an embodiment, referring to FIG. 5, the front surface of the display device 101 corresponds to an upper surface of the display device 101 which is spaced apart from the substrate 111 with the LED interposed therebetween, and the back surface of the display device 101 corresponds to a lower surface of the display device 101 which is spaced apart from the LED with the substrate 111 interposed therebetween.

In an embodiment, the reflective layer 250 may include at least one of Ag, Mg, Al, Pt, Pd, Au, Ni, Nd, Ir, Cr, Li, Ca, LiF/Ca, LiF/Al, Mo, Ti, and Cu. For example, the reflective layer 250 may include a metal alloy, a nitride, an oxide, or the like including at least one of Ag, Mg, Al, Pt, Pd, Au, Ni, Nd, Ir, Cr, Li, Ca, LiF/Ca, LiF/Al, Mo, Ti, and Cu, which may be used solely or in combination with each other. In an embodiment, the reflective layer 250 may have a multi-layer structure.

As illustrated in FIG. 5, the reflective layer 250 extends from the upper surface of the third insulating layer 237 to a boundary where the third insulating layer 237 contacts the planarization layer 137. Accordingly, in an embodiment, each of the third insulating layer 237 and the reflective layer 250 directly contacts the planarization layer 137, and may completely cover the first and second electrodes 211 and 221, the plurality of LEDs, the first and second contact electrodes CE1 and CE2, and the first and second insulating layers 235 and 236 disposed on the planarization layer 137. In other words, the first and second electrodes 211 and 221, the plurality of LEDs, the first and second contact electrodes CE1 and CE2, and the first, second, and third insulating layers 235, 236, and 237 may be disposed in the space defined by the planarization layer 137 and the reflective layer 250.

Opposite ends of the reflective layer 250, according to an embodiment of the present invention, are inclined with respect to the substrate 111. In particular, when opposite ends of the reflective layer 250 have inclined surfaces 250a, the two inclined surfaces 250a are positioned opposing each other in the first direction DR1, which is the direction of the major axis of the LED. In such an embodiment, the inclined surface 250a of the reflective layer 250 may be defined as a portion that is not perpendicular to or not parallel to the substrate 111. As the reflective layer 250 has the inclined surface 250a having an inclination (e.g., a predetermined inclination) with respect to the substrate 111, the luminous efficiency of light emitted to the back surface of the display device 101 may be improved.

Referring to FIGS. 5 and 8, a light L1 emitted from the LED is reflected by the reflective layer 250, passes through the substrate 111, and is emitted to the back surface of the substrate 111. In such an embodiment, the light L1 emitted from the LED may be emitted at an angle (e.g., a predetermined angle) with respect to the substrate 111. Particularly, when an imaginary straight line extending along the third direction DR3 perpendicular to the major axis of the LED is defined as a first straight line SL1, and an angle of the light L1 with respect to the first straight line SL1 is defined as an emission angle θ, it may be appreciated from FIG. 8 that the amount of light emission of the LED is relatively high when the emission angle θ is in a range from about ±60 degrees to about ±90 degrees. In other words, most of the light L1 emitted from the LED is emitted to have an angle in a range from about 0 degree to about ±30 degrees with respect to the major axis of the LED. In addition, the LEDs may emit most of light at opposite ends of the LEDs opposing each other in the first direction DR1.

As such, since the reflective layer 250 according to an embodiment of the present invention has the two inclined surfaces 250a that are positioned opposing each other in the first direction DR1, which is the major axis direction of the LED, the luminous efficiency of the light L1 emitted to the back surface of the display device 101 may be improved.

The encapsulation layer 270 is disposed on the reflective layer 250. The encapsulation layer 270 may be disposed over the entire surface of the substrate 111. The encapsulation layer 270 may serve to suppress penetration of moisture or oxygen into the display device 101 and to planarize the upper surface of the display device 101.

The encapsulation layer 270 may be an encapsulation film or a thin film encapsulation layer. For example, when the encapsulation layer 270 is an encapsulation film, the encapsulation layer 270 may include any of a polyethylene (PET) film, a polypropylene (PP) film, a polyamide (PA) film, a polyacetal (POM) film, a poly methyl methacrylate (PMMA) film, a polybutylene terephthalate (PBT) film, a polycarbonate (PC) film, a cellulose film, and moisture-resistant cellophane. In an embodiment, when the encapsulation layer 270 is a thin film encapsulation layer, the encapsulation layer 270 may include at least one inorganic layer and at least one organic layer that are alternately arranged. However, embodiments are not limited thereto, and the encapsulation layer 270 may be an encapsulation substrate.

In an embodiment, the encapsulation layer 270 may be formed to a thickness of about 10 μm or less. Accordingly, the overall thickness of the display device 101 may be made significantly thin. Such a display device 101 may have excellent flexible characteristics.

In addition, the display device 101 according to an embodiment of the present invention includes the polarizing layer 310 disposed on the back surface of the substrate 111, which is an emitting surface. That is, the polarizing layer 310 is disposed apart from the LED with the substrate 111 therebetween. The polarizing layer 310 may be a polarizing plate, a polarizing film, or a wire grid polarizer.

The polarizing layer 310 substantially prevents visibility from being degraded by the light incident from the outside. In particular, the polarizing layer 310 polarizes the light incident from the outside, such that the light incident into the display device 101 is substantially prevented from being reflected and emitted back to the outside. Accordingly, a decrease of a contrast ratio (CR) due to external light may be substantially prevented.

In addition, the polarizing layer 310 according to an embodiment of the present invention is not attached or formed on the encapsulation layer 270 having a relatively low flatness, and attached to the back surface of the substrate 111 having a relatively high flatness, and, thus, may have a more stable and uniform shape.

Herein, a method of manufacturing a display device according to an embodiment of the present invention will be described with reference to FIGS. 9A to 9G.

FIGS. 9A to 9G are perspective views and cross-sectional views illustrating a method of manufacturing a display device according to an embodiment of the present invention.

Figure 9A:
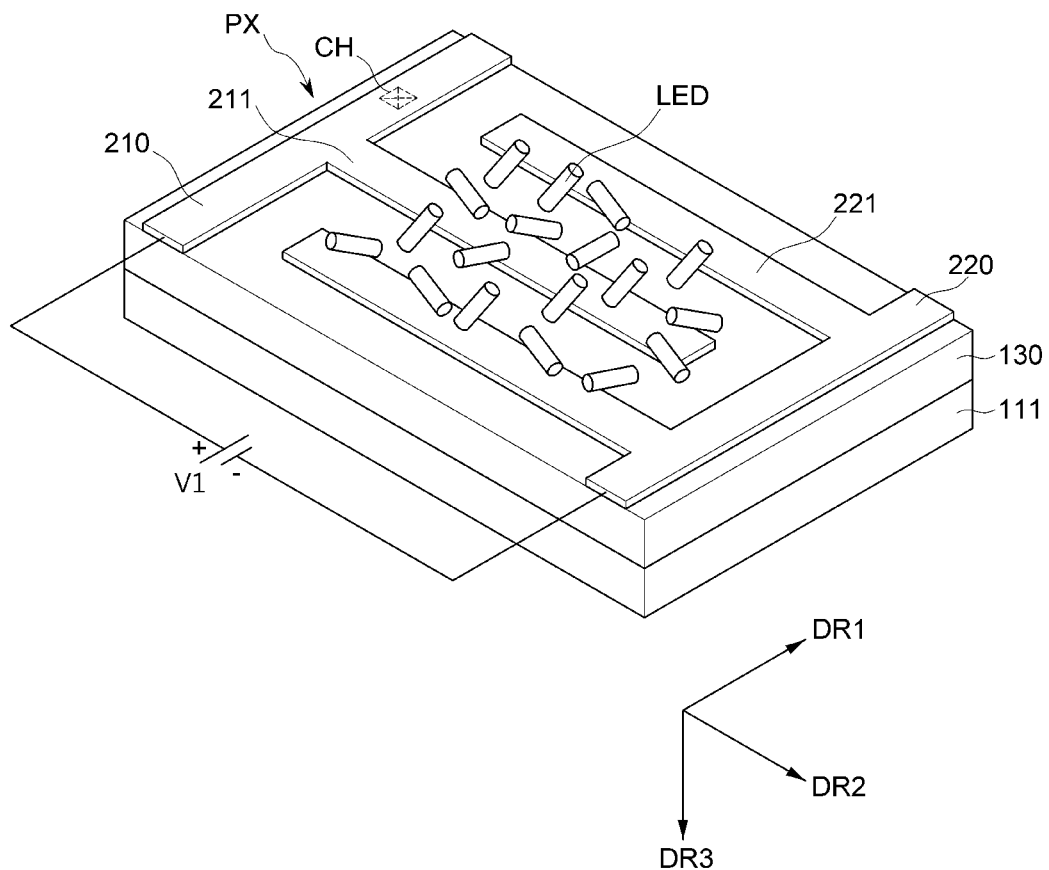
FIGS. 9A to 9G are perspective views and cross-sectional views illustrating a method of manufacturing a display device according to an embodiment of the present invention.

First, referring to FIG. 9A, the plurality of LEDs are disposed on the substrate 111 on which the driving circuit unit 130, the first and second wirings 210 and 220, and the first and second electrodes 211 and 221 are disposed. In such an embodiment, the plurality of LEDs may be coated on the substrate 111 in a solution state mixed with a solvent. The solution may include a solvent in an amount ranging from about 100 wt % to about 12,000 wt % with respect to 100 wt % of the LED. When the solvent is more than about 12,000 wt % with respect to 100 wt % of the LED, the number of the LEDs per unit area is reduced, and thus the luminous efficiency may be lowered. On the other hand, when the solvent is less than about 100 wt % with respect to 100 wt % of the LED, the movement and alignment of the LEDs may be restricted, the number of the LEDs that are not aligned to be removed may increase, and, thus, the manufacturing costs may increase. However, embodiments are not limited thereto, and the concentration of the solution 200 (wt % of the LEDs) including the LED may be determined in consideration of the distance between the first and second electrodes 211 and 221, and the aspect ratio of the LED.

Any solvent that may not impose physical and chemical damage to the LED, may facilitate dispersion and movement the LED, and may be vaporized and easily removed may be used without limitation. For example, the solvent may be any one of acetone, water, alcohol, and toluene.

The plurality of LEDs floating in the solution without a predetermined directionality may be self-aligned by a voltage V1 applied to the first and second electrodes 211 and 221. That is, it is practically difficult to manually arrange the LEDs having a nanometer or micrometer size so as to have directivity between the first and second electrodes 211 and 221. Accordingly, the voltage V1 may be applied to the first and second electrodes 211 and 221 through the first and second electrodes 220 and 220 to self-align the plurality of LEDs. Accordingly, each of the plurality of LEDs may be aligned along the first direction DR1 perpendicular to the extending direction of the first and second electrodes 211 and 221.

Figure 9B:
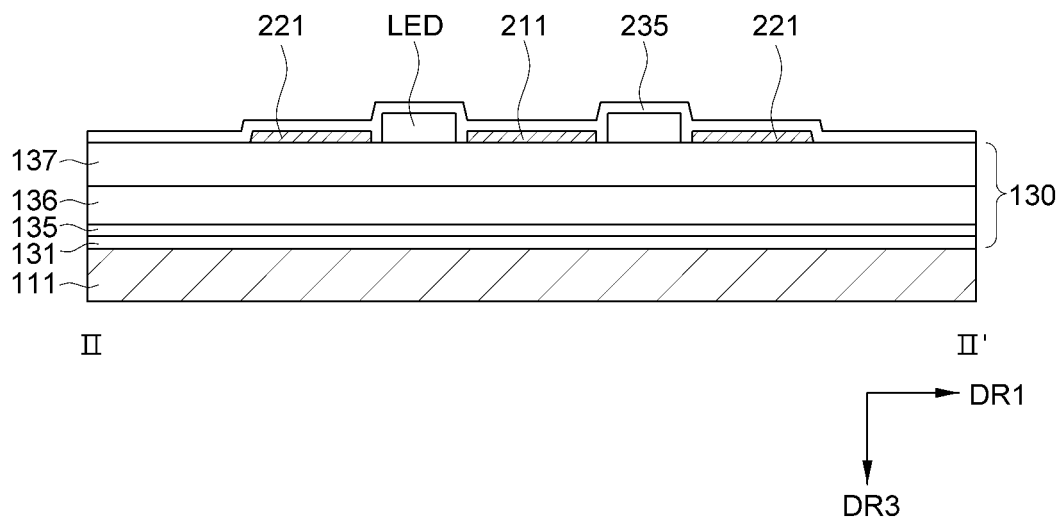

Next, referring to FIG. 9B, the first insulating layer 235 is formed on the substrate 111 on which the first and second electrodes 211 and 221 and the plurality of LEDs are disposed. The first insulating layer 235 may be formed by depositing an inorganic insulating material, such as any of silicon nitride ($SiN_x$), silicon oxide ($SiO_2$), silicon oxynitride ($SiO_xN_y$), aluminum oxide ($Al_2O_3$), hafnium oxide ($HfO_2$), yttrium oxide ($Y_2O_3$), and titanium dioxide ($TiO_2$) in a PECVD method, an APCVD method, an LPCVD method, an ERC method, or the like. In an embodiment, the first insulating layer 235 may have a multi-layer structure including at least two insulating layers having different physical properties.

The first insulating layer 235 substantially prevents the plurality of LEDs aligned between the first and second electrodes 211 and 221 from moving during the subsequent process. That is, the first insulating layer 235 serves to fix the plurality of LEDs on the substrate 111. In addition, the first insulating layer 235 substantially prevents an electric short circuit between the first electrode 211 and the second electrode 221 or between the first electrode layer 205 (see FIG. 6) and the second electrode layer 206 (see FIG. 6) of the LED.

Figure 9C:
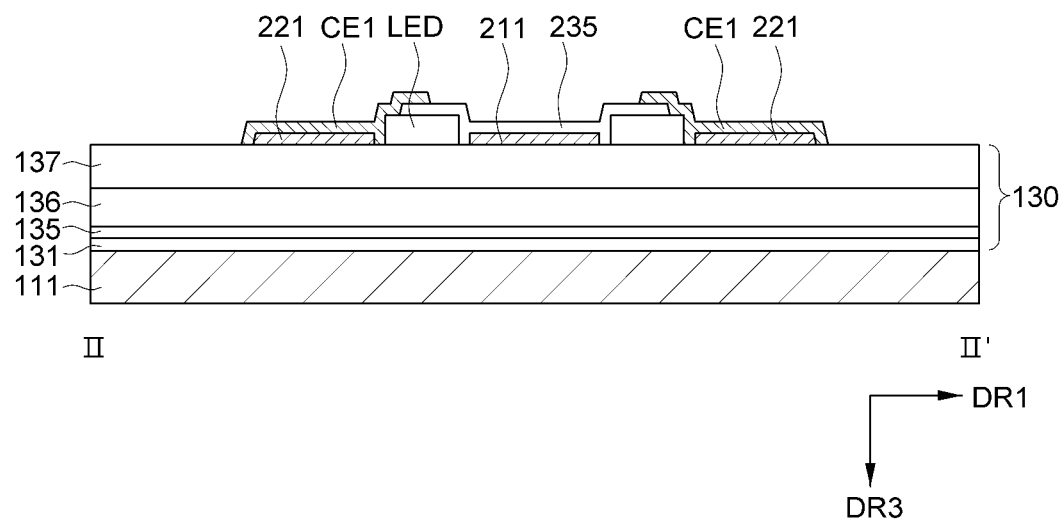

Next, referring to FIG. 9C, the first insulating layer 235 overlapping the second electrode 221 and at least a part of the LED adjacent to the second electrode 221 is removed, and the first contact electrode CE1 is formed on the exposed portion of the second electrode 221 and the LED. That is, in order to connect the LED and the second electrode 221 through the first contact electrode CE1, the first insulating layer 235 may be completely removed except a portion overlapping the first electrode 211 and at least a part of the LED adjacent to the first electrode 211. In an embodiment, the first insulating layer 235 may be removed by physical or chemical etching. For example, the first insulating layer 235 may be removed by dry etching using an etching gas.

Figure 9D:
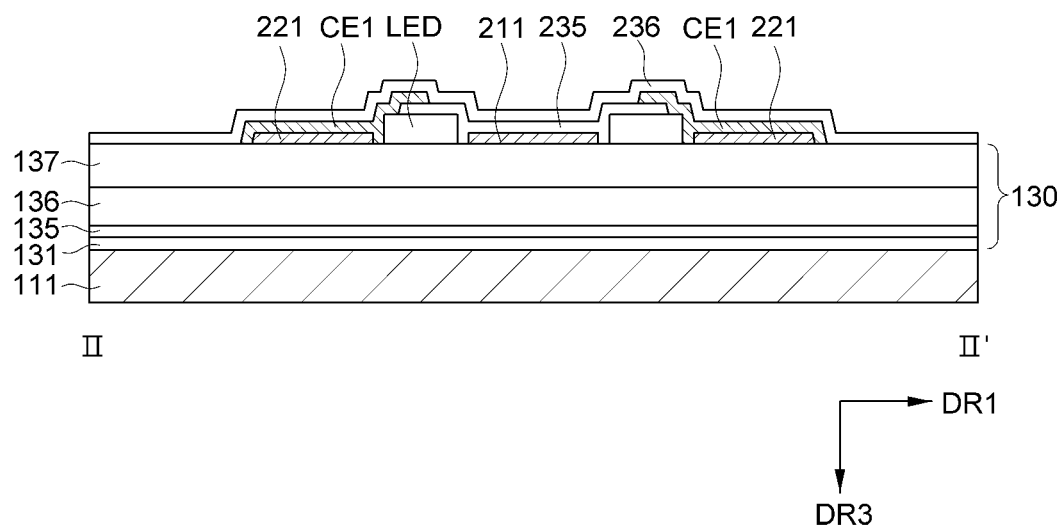

Next, referring to FIG. 9D, the second insulating layer 236 is formed on the substrate 111 on which the first contact electrode CE1 is formed. The second insulating layer 236 may be formed by depositing an inorganic insulating material, such as any of silicon nitride ($SiN_x$), silicon oxide ($SiO_2$), silicon oxynitride ($SiO_xN_y$), aluminum oxide ($Al_2O_3$), hafnium oxide ($HfO_2$), yttrium oxide ($Y_2O_3$), and titanium dioxide ($TiO_2$) in a PECVD method, an APCVD method, an LPCVD method, an ERC method, or the like. In an embodiment, the second insulating layer 236 may have a multi-layer structure including at least two insulating layers having different physical properties.

The second insulating layer 236 substantially prevents an electric short circuit between the first electrode 211 and the second electrode 221 or between the first electrode layer 205 (see FIG. 6) and the second electrode layer 206 (see FIG. 6) of the LED.

Figure 9E:
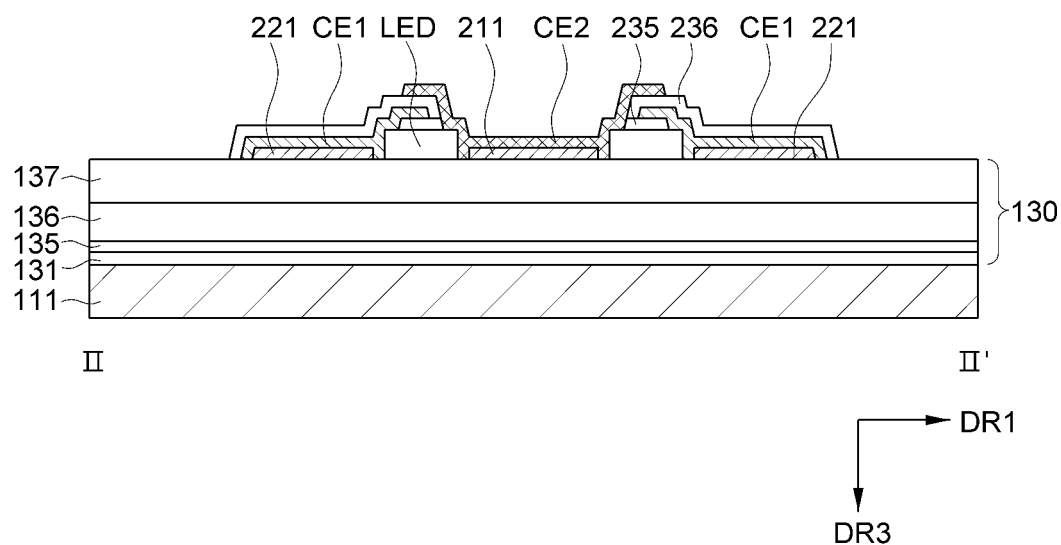

Next, referring to FIG. 9E, the first and second insulating layers 235 and 236 overlapping the first electrode 211 and at least a part of the LED adjacent to the first electrode 211 are removed, and the second contact electrode CE2 is formed on the exposed portion of the first electrode 211 and the LED. That is, in order to connect the LED and the first electrode 211 through the second contact electrode CE2, the second insulating layer 236 may be completely removed except a portion overlapping the second electrode 221 and at least a part of the LED adjacent to the second electrode 221. In an embodiment, the second insulating layer 236 may be removed by physical or chemical etching. In an embodiment, the first and second insulating layers 235 and 236 may be substantially simultaneously removed by a substantially same process. For example, the first and second insulating layers 235 and 236 may be removed by dry etching using an etching gas.

Accordingly, the first insulating layer 235 may be positioned on the LED between the first and second electrodes 211 and 221 without overlapping the first and second electrodes 211 and 221. In addition, the second insulating layer 236 may not overlap the first electrode 211 and may be located on the second electrode 221 and the LED.

Figure 9F:
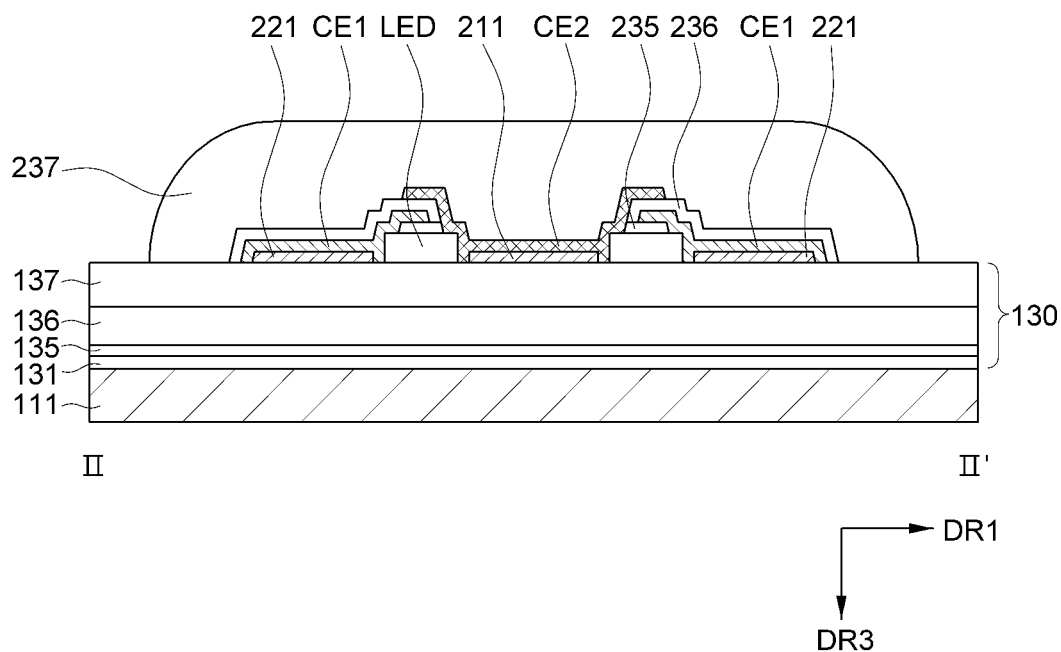

Next, referring to FIG. 9F, the third insulating layer 237 is formed to completely cover the first and second electrodes 211 and 221, the plurality of LEDs, the first and second contact electrodes CE1 and CE2, and the first and second insulating layers 235 and 235. The third insulating layer 237 may be formed to cover at least one pixel PX.

The third insulating layer 237 includes a light transmitting material so as to efficiently guide light. For example, the third insulating layer 237 may be formed by spin coating using an organic insulating material including at least one of an acrylic resin, an epoxy resin, polyimide, and polyethylene. In an embodiment, the third insulating layer 237 may be formed by applying a photosensitive organic insulating material over the entire surface of the substrate 111 and patterning the photosensitive organic insulating material using a mask. Accordingly, the third insulating layer 237 may be formed to have opposite side surfaces opposing each other in the first direction DR1, which is the major axis direction of the LED.

Figure 9G:
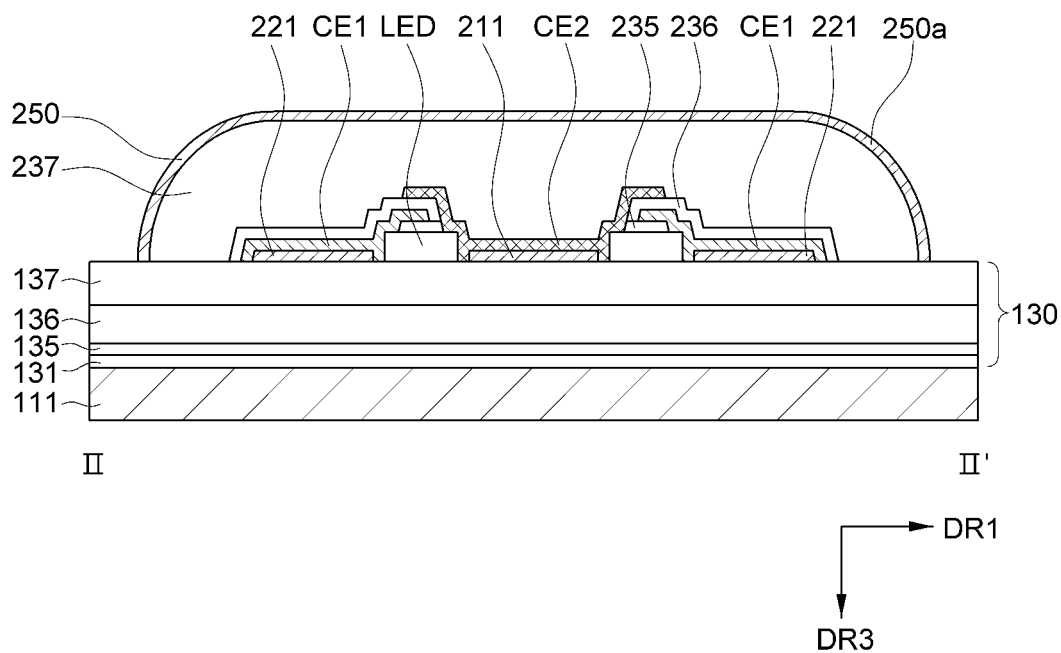

Next, referring to FIG. 9G, the reflective layer 250 is formed on the third insulating layer 237. In an embodiment, the reflective layer 250 may include at least one of Ag, Mg, Al, Pt, Pd, Au, Ni, Nd, Ir, Cr, Li, Ca, LiF/Ca, LiF/Al, Mo, Ti, and Cu, and may be formed through a deposition process. In an embodiment, the reflective layer 250 is formed having substantially the same shape as the surface of the third insulating layer 237 contacting the reflective layer 250. That is, the inclined surfaces 250a, which are opposite ends of the reflective layer 250, are positioned opposing each other in the first direction DR1, which is the direction of the major axis of the LED. Accordingly, the luminous efficiency of light emitted to the back surface of the display device 101 may be improved.

Herein, another embodiment of the present invention will be described with reference to FIG. 10. The description of the same configurations as that of an above-described embodiment of the present invention will be omitted for the convenience of explanation.

Figure 10:
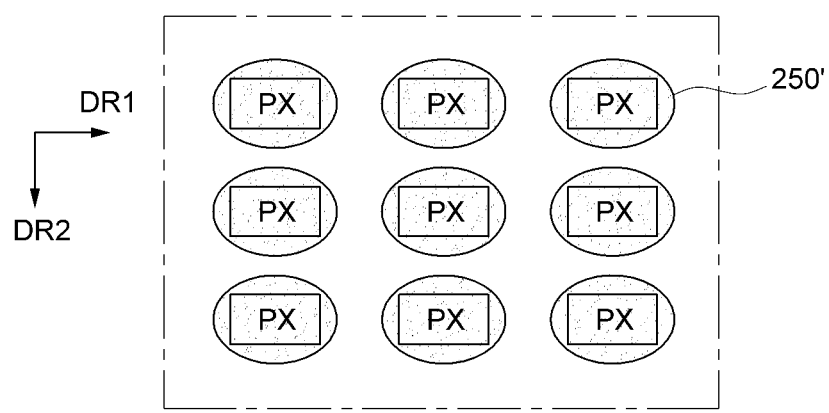
FIG. 10 is a plan view schematically illustrating a plurality of pixels and a reflective layer according to another embodiment of the present invention.

FIG. 10 is a plan view schematically illustrating a plurality of pixels and a reflective layer according to another embodiment of the present invention.

Referring to FIG. 10, reflective layers 250' according to another embodiment of the present invention may be disposed to cover each corresponding one of the plurality of pixels PX. In such an embodiment, the reflective layer 250' may have substantially the same shape as that of the third insulating layer 237 on a plane. For example, the third insulating layer 237 may have a dome shape covering each respective one of the pixels PX, and the reflective layer 250' may be disposed on the third insulating layer 237 having a dome shape.

That is, the reflective layer 250' according to another embodiment of the present invention may have an island shape covering each respective one of the pixels PX, dissimilar to the reflective layer 250 according to the embodiment of the present invention that has a line shape. However, embodiments are not limited thereto, and the reflective layer 250' may have an island shape covering two to four pixels PX adjacent one another.

Herein, another embodiment of the present invention will be described with reference to FIG. 11. The description of the same configurations as that of an above-described embodiment of the present invention will be omitted for the convenience of explanation.

Figure 11:
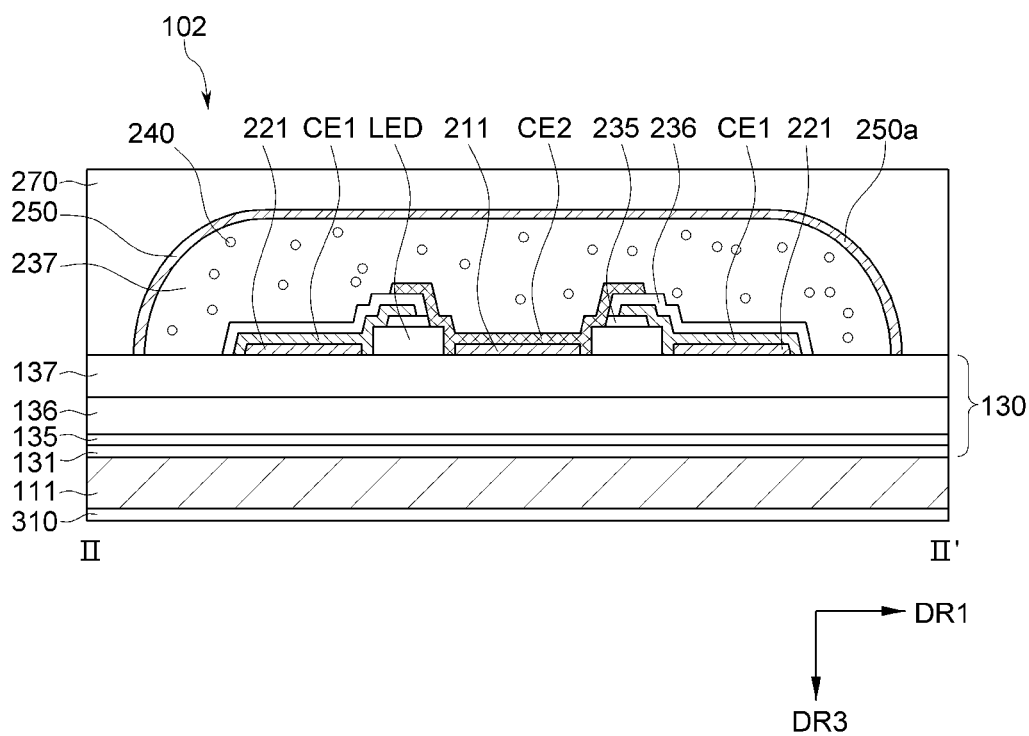
FIG. 11 is a cross-sectional view illustrating a display device according to another embodiment of the present invention.

FIG. 11 is a cross-sectional view illustrating a display device according to another embodiment of the present invention.

Referring to FIG. 11, the third insulating layer 237 of a display device 102 according to another embodiment of the present invention includes light scattering particles 240. The light scattering particles 240 are not particularly limited and may be commonly used, and may include, for example, at least one of $TiO_2$, $SiO_2$, and ZnO, for example.

The refractive index of the light scattering particles 240 is different from the refractive index of the third insulating layer 237. Accordingly, light passing through the third insulating layer 237 and the light scattering particles 240 is refracted and scattered, thereby reducing the color deviation according to the viewing angle. In an embodiment, for example, the light scattering particles 240 may have a refractive index in a range from about 1.41 to about 1.60, and the difference in refractive index between the third insulating layer 237 and the light scattering particles 240 may be in a range from about 0.01 to about 0.20, but embodiments are not limited thereto.

The content, size, shape, or the like of the light scattering particles 240 are not particularly limited and may be suitably selected in consideration of the characteristics of the third insulating layer 237 and the LED. For example, when the light scattering particles 240 are spherical, the diameter (nm) of the light scattering particles 240 may be about 0.1 to about 5 times the wavelength (nm) of the light emitted from the LED, which improves the scattering efficiency of the emitted light.

In an embodiment, the light scattering particle 240 may include a core and a shell. When the light scattering particles 240 includes a core and a shell, the refractive index of the light scattering particles 240 may be easily adjusted to a desired value.

In addition, the light scattering particles 240 may include a phosphor (e.g., a fluorescent element). When the light scattering particles 240 include a phosphor, the light scattering particles 240 may convert the wavelength of light incident thereto from the LED to emit light having a different wavelength. Accordingly, the color purity of the display device 102 may be improved.

As the display device 102 according to another embodiment of the present invention further includes the light scattering particles 240 in the third insulating layer 237 having a light transmitting property, the color deviation according to the viewing angle may be reduced, and the luminous efficiency of the display device 102 may be improved.

Herein, another embodiment of the present invention will be described with reference to FIG. 12. The description of the same configurations as that of an above-described embodiment of the present invention will be omitted for the convenience of explanation.

Figure 12:
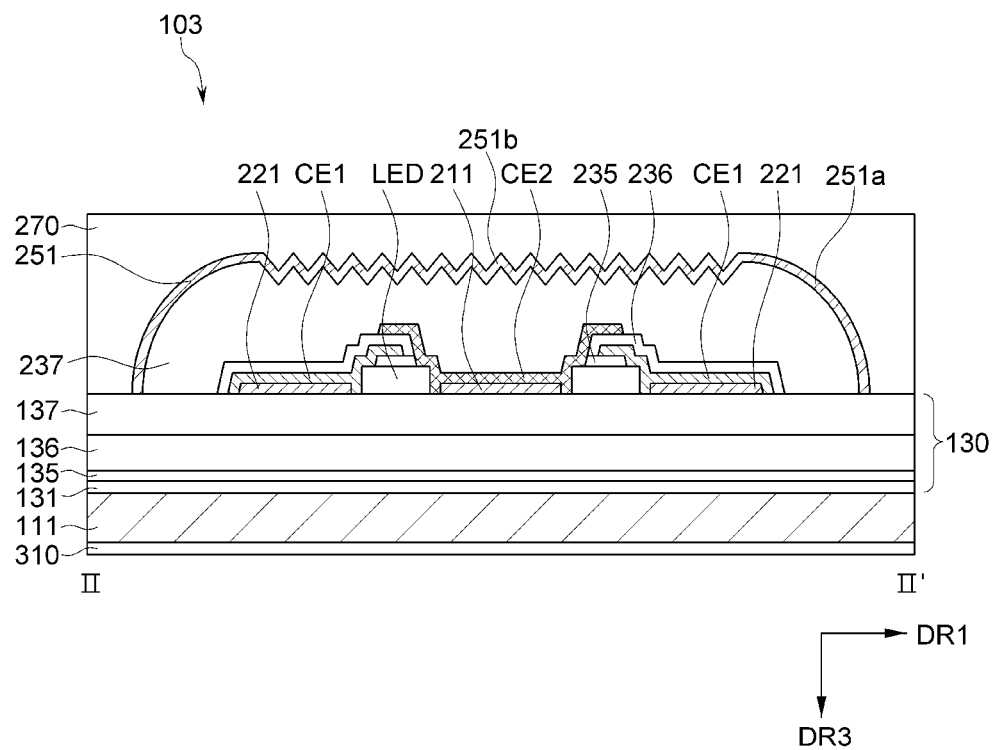
FIG. 12 is a cross-sectional view illustrating a display device according to another embodiment of the present invention.

FIG. 12 is a cross-sectional view illustrating a display device according to another embodiment of the present invention.

Referring to FIG. 12, a reflective layer 251 of a display device 103 according to another embodiment of the present invention has a concavo-convex pattern 251b to improve reflection efficiency and inclined surfaces 251a.

For example, an upper surface of the third insulating layer 237 is patterned so as to have a plurality of concavo-convex shapes such that at least a part of the reflective layer 251 disposed on the third insulating layer 237 has the concavo-convex pattern 251b. In such an embodiment, although each of the plurality of concavo-convex shapes of the third insulating layer 237 is shown as being triangular in cross-section, embodiments are not limited thereto, and the plurality of concavo-convex shapes may have any of various shapes such as a circle, an ellipse, and a polygon. Depending on the shape of the plurality of concavo-convex shapes, the shape of the concavo-convex pattern 251b of the reflection layer 251 may be variously modified.

When the upper surface of the reflective layer 251 has the concave-convex pattern 251b, the reflection efficiency of the reflective layer 251 may be improved and a problem in which the light emitted from the LED is reflected only in a specific direction to cause non-uniform luminance may be substantially prevented.

That is, since the display device 103 according to still another embodiment of the present invention includes the reflection layer 251 having the concavo-convex pattern 251b, the light emitted from the LED may be more efficiently reflected, and the luminous efficiency and display quality of the display device 103 may be improved.

Herein, another embodiment of the present invention will be described with reference to FIG. 13. The description of the same configurations as that of an above-described embodiment of the present invention will be omitted for the convenience of explanation.

Figure 13:
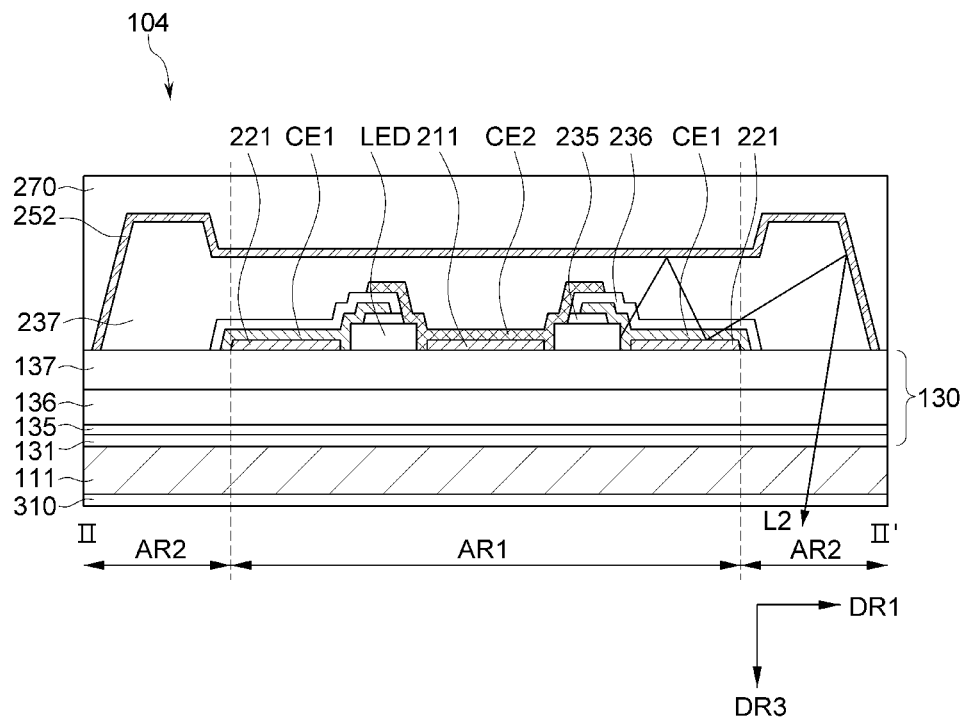
FIG. 13 is a cross-sectional view illustrating a display device according to another embodiment of the present invention.

FIG. 13 is a cross-sectional view illustrating a display device according to another embodiment of the present invention.

Referring to FIG. 13, each pixel PX of a display device 104 according to another embodiment of the present invention may be divided into a light guide area AR1 and a light emission area AR2. In such an embodiment, the light guide area AR1 and the light emission area AR2 may be divided with respect to an end of the second electrode 221 that is spaced apart from the LED by a maximum distance along the first direction DR1. A light L2 emitted from the LED passes through the light guide area AR1 and is emitted to the back surface of the display device 104 in the light emission area AR2.

The first and second electrodes 211 and 221 are disposed in the light guide area AR1 and each include a reflective material. For example, the first and second electrodes 211 and 221 may include at least one of Ag, Mg, Al, Pt, Pd, Au, Ni, Nd, Ir, Cr, Li, Ca, LiF/Ca, LiF/Al, Mo, Ti, and Cu, which may be used solely or in combination with each other, and the first and second electrodes 211 and 221 may have a multi-layer structure. Accordingly, the light L2 emitted from the LED may be reflected by the first and second electrodes 211 and 221 and a reflective layer 252 in the light guide area AR1.

The light L2 that has passed through the light guide area AR1 may be emitted to the back surface of the display device 104 through the light emission area AR2 where the first and second electrodes 211 and 221 are not located. The light L2 emitted from the LED may be diffused and emitted evenly throughout the light emission area AR2 by passing through the light guide area AR1. That is, the light guide area AR1 may serve to convert a point light source or a linear light source into a surface light source.

In an embodiment, in order to guide the light L2 more efficiently, a distance from the substrate 111 to the upper surface of the third insulating layer 237 in the light guide area AR1 may be formed to be less than a distance from the substrate 111 to the upper surface of the third insulating layer 237 in the light emission area AR2. However, embodiments are not limited thereto, and the distance from the substrate 111 to the upper surface of the third insulating layer 237 in the light guide area AR1 may be substantially equal to the distance from the substrate 111 to the upper surface of the third insulating layer 237 in the light emission area AR2.

Since the display device 104 according to another embodiment of the present invention includes the light guide area AR1 and the light emission area AR2 and includes the second electrode 221 including a reflective material, the light L2 emitted from the LED may be emitted more evenly in the light emission area AR2, and the display quality of the display device 104 may be improved.

Herein, another embodiment of the present invention will be described with reference to FIG. 14. The description of the same configurations as that of an above-described embodiment of the present invention will be omitted for the convenience of explanation.

Figure 14:
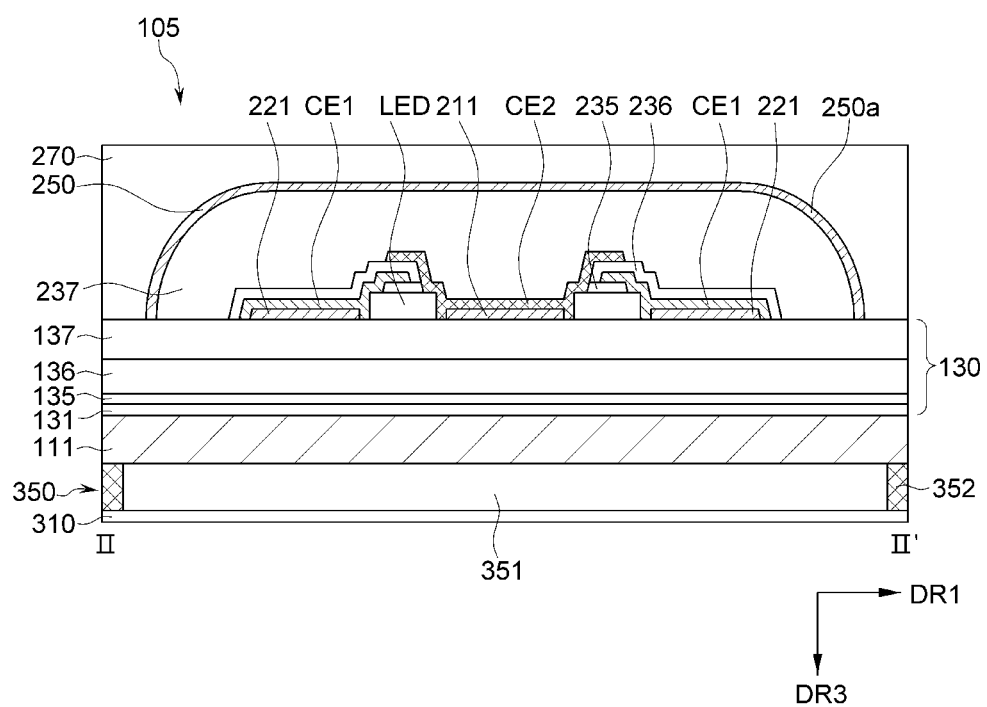
FIG. 14 is a cross-sectional view illustrating a display device according to another embodiment of the present invention.

FIG. 14 is a cross-sectional view illustrating a display device according to another embodiment of the present invention.

Referring to FIG. 14, a display device 105 according to another embodiment of the present invention further includes a color conversion layer 350 disposed between the substrate 111 and the polarizing layer 310.

The color conversion layer 350 converts the wavelength of light incident thereto from the LED to emit light having a different wavelength. The color conversion layer 350 includes a plurality of color conversion portions 351 and a light blocking portion 352.

In an embodiment, the plurality of color conversion portions 351 may be distinguished from each other by the light blocking portion 352. For example, the plurality of color conversion portions 351 may be located at an opening of the light blocking portion 352 corresponding to each pixel PX. In an embodiment, at least a part of each color conversion portion 351 may be disposed so as to overlap the light blocking portion 352.

In an embodiment, the plurality of color conversion portions 351 may include at least one of a red conversion portion corresponding to a red pixel, a green conversion portion corresponding to a green pixel, and a blue conversion portion corresponding to a blue pixel. The red conversion portion includes a red phosphor and may emit red light by absorbing the light emitted from the LED. The green conversion portion includes a green phosphor and may emit green light by absorbing light emitted from the LED. The blue conversion portion includes a blue phosphor and may emit blue light by absorbing light emitted from the LED.

In an embodiment, the color conversion layer 350 may further include a transmissive portion. The wavelength of the light passing through the transmissive portion does not change. Accordingly, the light emitted from the LED may pass through the transmissive portion to be emitted to the back surface of the display device 105 as it is. In order to improve the viewing angle characteristics, the transmissive portion may include light scattering particles.

The color conversion portion 351 may include a resin including a phosphor. The phosphor is a substance that emits fluorescence when irradiated with light or radiation, and emits light having a specific wavelength of the phosphor. In addition, the phosphor emits light to the entire area regardless of the direction of the incident light. According to an embodiment of the present invention, quantum dots may be used as the phosphor. In such an embodiment, the quantum dot is not limited to a spherical shape, but may have a shape such as any of a rod, a pyramid, a multi-arm, a cubic nanoparticle, a nanotube, a nanowire, a nanofiber, and a nanoplate.

The quantum dot absorbs light incident thereto and emits light having a different wavelength from a wavelength of the incident light. That is, the quantum dot is a wavelength converting particle that may convert the wavelength of light incident to the quantum dot. A wavelength range of light that a quantum dot may convert may vary depending on the size of the quantum dot. For example, by adjusting the diameter of the quantum dot, the quantum dot may emit light of a desired color.

In general, the quantum dot has a high extinction coefficient and a high quantum yield, and emits significantly intense fluorescence. In particular, the quantum dot may absorb light of a short wavelength and may emit light of a longer wavelength. In an embodiment, the quantum dot may have a full width of half maximum (FWHM) of the emission wavelength spectrum of about 45 nm or less, and, in an embodiment, about 40 nm or less, and, in an embodiment, about 30 nm or less, and the color purity or color gamut may be improved in the above range. In addition, since the light emitted through the quantum dots may be emitted toward all directions, a viewing angle may be improved.

In an embodiment, the quantum dot may have a structure including a core nanocrystal and a shell nanocrystal surrounding the core nanocrystal. In an embodiment, the quantum dot may include an organic ligand bonded to the shell nanocrystal, or may include an organic coating layer surrounding the shell nanocrystal. In an embodiment, the shell nanocrystal may be formed having two or more layers. The shell nanocrystal is placed on the surface of the core nanocrystal. In an embodiment, an interface between the core nanocrystal and the shell nanocrystal may have a concentration gradient, that is, the concentration of elements existing in the shell nanocrystal becomes lower toward the center.

In an embodiment, the quantum dot may include at least one of: Group II compound semiconductors, Group III compound semiconductors, Group IV compound semiconductors, Group V compound semiconductors, and Group VI compound semiconductors. For example, the quantum dot may be selected from: Group II-VI compounds, Group III-V compounds, Group IV-VI compounds, Group IV elements, Group IV compounds, and combinations thereof.

In an embodiment, the Group II-VI compound may be selected from the group consisting of: binary compounds of CdO, CdS, CdSe, CdTe, ZnO, ZnS, ZnSe, ZnTe, HgS, HgSe, HgTe, MgSe, MgS, and mixtures thereof; ternary compounds of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and quaternary compounds of CdZnSeS, CdZnSeTe, CdZnSTe, CdHgSeS, CdHgSeTe, CdHgSTe, HgZnSeS, HgZnSeTe, HgZnSTe, and mixtures thereof. In an embodiment, the Group III-V compound may be selected from the group consisting of: binary compounds of GaN, GaP, GaAs, GaSb, AlN, AlP, AlAs, AlSb, InN, InP, InAs, InSb, and mixtures thereof; ternary compounds of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; and quaternary compounds of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In an embodiment, the Group IV-VI compound may be selected from the group consisting of: binary compounds of SnS, SnSe, SnTe, PbS, PbSe, PbTe, and mixtures thereof; ternary compounds of SnSeS, SnSeTe, SnSTe, PbSeS, PbSeTe, PbSTe, SnPbS, SnPbSe, SnPbTe, and mixtures thereof; and quaternary compounds of SnPbSSe, SnPbSeTe, SnPbSTe, and mixtures thereof. In an embodiment, the Group IV element may be selected from the group consisting of Si, Ge, and mixtures thereof. In an embodiment, the Group IV compound may be selected from the group consisting of SiC, SiGe, and mixtures thereof.

In such an embodiment, the binary compound, the ternary compound, or the quaternary compound may be present in the particle at a uniform concentration, or the concentration distributions thereof may be partially different in the same particle.

Even quantum dots of substantially the same composition may produce different lights depending on their diameters. For example, in the case in which the core nanocrystal includes CdSe, blue light may be generated when the diameter of the quantum dots is in a range from about 1 nm to about 3 nm, green light may be generated when the diameter of the quantum dots is in a range from about 3 nm to about 5 nm, and red light may be generated when the diameter of the quantum dots is in a range from about 7 nm to about 10 nm.

As the display device according to an embodiment of the present invention further includes the color conversion layer 350 including the phosphor such as quantum dots, the color purity of the display device 105 may be improved, and the display quality of the display device 105 may be improved.

Herein, another embodiment of the present invention will be described with reference to FIG. 15. The description of the same configurations as that of an above-described embodiment of the present invention will be omitted for the convenience of explanation.

Figure 15:
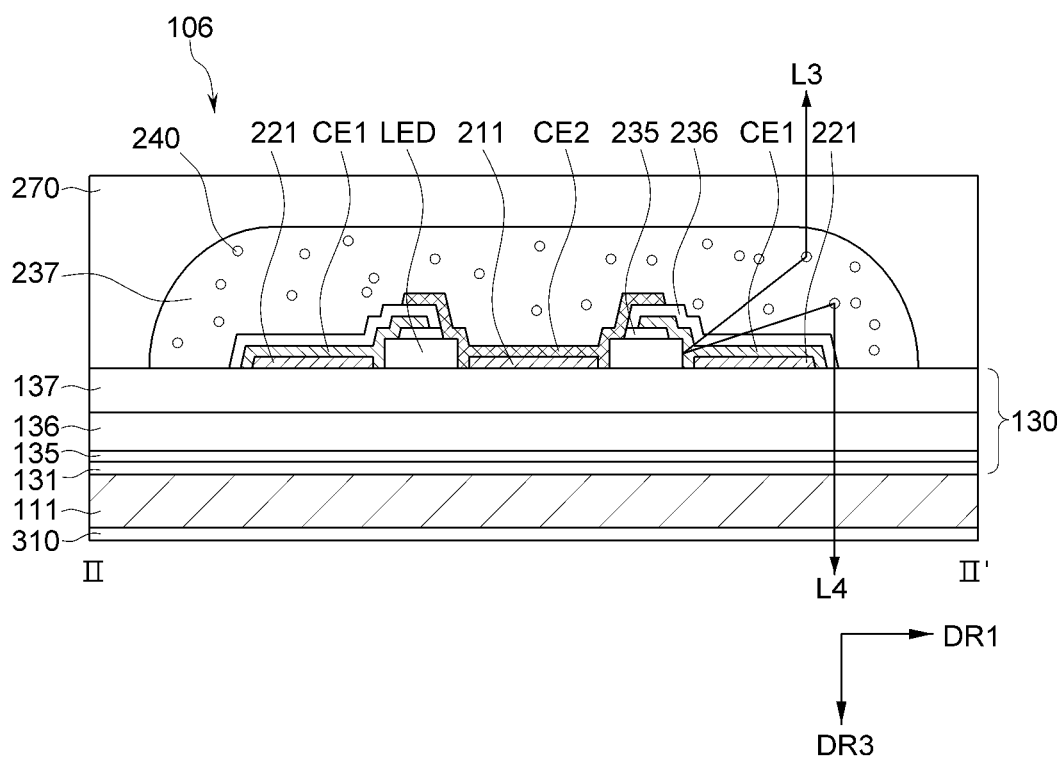
FIG. 15 is a cross-sectional view illustrating a display device according to another embodiment of the present invention.

FIG. 15 is a cross-sectional view illustrating a display device according to another embodiment of the present invention.

Referring to FIG. 15, a display device 106 according to another embodiment of the present invention is of a dual emission type in which lights L3 and L4 emitted from the LED may be emitted to both of the front surface and the back surface of the display device 106. That is, dissimilar to the display device 101 according to an embodiment of the present invention, the display device 106 according to another embodiment of the present invention does not include a reflective layer.

The third insulating layer 237 includes light scattering particles 240. The light scattering particles 240 are not particularly limited and may be commonly used, and may include, for example, at least one of $TiO_2$, $SiO_2$, and ZnO.

The refractive index of the light scattering particles 240 is different from the refractive index of the third insulating layer 237. Accordingly, light passing through the third insulating layer 237 and the light scattering particles 240 is refracted and scattered to be emitted to the front and back surfaces of the display device 106, and thus the color deviation according to the viewing angle may be reduced. For example, the light scattering particles 240 may have a refractive index in the range from about 1.41 to about 1.60, and the difference in refractive index between the third insulating layer 237 and the light scattering particles 240 may be in the range from about 0.01 to about 0.20, but embodiments are not limited thereto.

The content, size, shape, or the like of the light scattering particles 240 are not particularly limited and may be suitably selected in consideration of the characteristics of the third insulating layer 237 and the LED. For example, when the light scattering particles 240 are spherical, the diameter (nm) of the light scattering particles 240 may be about 0.1 to about 5 times the wavelength (nm) of the light emitted from the LED, which is to improve the scattering efficiency of the emitted light.

In an embodiment, the light scattering particle 240 may include a core and a shell. When the light scattering particles 240 include a core and a shell, the refractive index of the light scattering particles 240 may be easily adjusted to a desired value.

Since the display device 106 according to another embodiment of the present invention is a dual emission type display device that does not include a reflective layer and includes the light scattering particles 240 in the third insulating layer 237 having a light transmitting property, light may be more efficiently emitted to the front surface and the back surface of the display device 106, and the color deviation according to the viewing angle may be reduced.

As set forth herein, according to one or more embodiments of the present invention, the display device may improve the luminous efficiency of the light emitted to the back surface of the display device by including a reflective layer having an inclined surface.

In addition, according to one or more embodiments of the present invention, the display device may improve the luminous efficiency of the light emitted to the back surface and the front surface of the display device and reduce color deviation according to the viewing angle by including light scattering elements in the insulating layer having light transmittance.

While the present invention has been illustrated and described with reference to some embodiments thereof, it will be apparent to those of ordinary skill in the art that various changes in form and detail may be made thereto without departing from the spirit and scope of the present invention.

What is claimed is:

1. A display device comprising:
a substrate;
a thin film transistor on the substrate;
a first electrode on the substrate and connected to the thin film transistor;
a second electrode on the substrate and spaced apart from the first electrode;
a plurality of light emitting elements between the first and second electrodes and electrically connected to each of the first and second electrodes;
an insulating layer on the plurality of light emitting elements; and
a reflective layer on the insulating layer,
wherein each of the plurality of light emitting elements comprises a first semiconductor layer, an active layer on the first semiconductor layer, and a second semiconductor layer on the active layer, and the first semiconductor layer, the active layer, and the second semiconductor layer are sequentially disposed in a direction parallel to an upper surface of the substrate.

2. The display device of claim 1, wherein the insulating layer and the reflective layer cover the first electrode, the second electrode, and the light emitting element.

3. The display device of claim 1, wherein opposite ends of the reflective layer have inclined surfaces, and
the inclined surfaces are located opposing each other in a direction of a major axis of the light emitting element.

4. The display device of claim 1, further comprising a plurality of pixels on the substrate,
wherein the reflective layer covers a plurality of pixels that are arranged along a direction.

5. The display device of claim 1, further comprising a plurality of pixels on the substrate,
wherein the reflective layer has an island shape covering each respective one of the plurality of pixels.

6. The display device of claim 1, wherein the first and second electrodes are on a substantially same layer, and
the second electrode comprises two second electrodes spaced apart from each other with the first electrode therebetween.

7. The display device of claim 1, wherein each of the first and second electrodes comprises at least one of indium tin oxide, indium zinc oxide, zinc oxide, and indium tin zinc oxide.

8. The display device of claim 1, further comprising:
a first contact electrode on the light emitting element and the second electrode, the first contact electrode directly contacting the light emitting element and the second electrode; and
a second contact electrode on the first electrode and the light emitting element, the second contact electrode directly contacting the first electrode and the light emitting element.

9. The display device of claim 1, further comprising a first insulating layer on the light emitting element,
wherein the first insulating layer does not overlap the first and second electrodes.

10. The display device of claim 1, further comprising a second insulating layer on the light emitting element and the second electrode,
wherein the second insulating layer does not overlap the first electrode.

11. The display device of claim 1, wherein the light emitting element has a cylindrical shape, and
a diameter of the light emitting element is from about 100 nm to about 1 μm.

12. The display device of claim 1, further comprising light scattering particles in the insulating layer,
wherein the light scattering particles have a refractive index different from a refractive index of the insulating layer.

13. The display device of claim 1, wherein the reflective layer has a concavo-convex pattern.

14. The display device of claim 1, wherein the substrate comprises a light guide area and a light emission area,
the first and second electrodes are arranged at the light guide area of the substrate, and
a light emitted from the light emitting element is emitted through the light emission area of the substrate.

15. The display device of claim 14, wherein each of the first and second electrodes comprises at least one of Ag, Mg, Al, Pt, Pd, Au, Ni, Nd, Ir, Cr, Li, Ca, LiF/Ca, LiF/Al, Mo, Ti, and Cu.

16. The display device of claim 1, further comprising a polarizing layer arranged apart from the light emitting element with the substrate therebetween.

17. The display device of claim 16, further comprising a color conversion layer between the substrate and the polarizing layer.

18. A display device comprising:
a substrate;
a thin film transistor on the substrate;
a first electrode on the substrate and connected to the thin film transistor;
a second electrode on the substrate and spaced apart from the first electrode;
a plurality of light emitting elements between the first and second electrodes and electrically connected to each of the first and second electrodes;
an insulating layer on the plurality of light emitting elements; and
light scattering particles in the insulating layer,
wherein each of the plurality of light emitting elements comprises a first semiconductor layer, an active layer on the first semiconductor layer, and a second semiconductor layer on the active layer, and the first semiconductor layer, the active layer, and the second semiconductor layer are sequentially disposed in a direction parallel to an upper surface of the substrate.

19. The display device of claim 18, wherein each of the first and second electrodes comprises at least one of indium tin oxide, indium zinc oxide, zinc oxide, and indium tin zinc oxide.

20. The display device of claim 18, further comprising:
a first contact electrode on the light emitting element and the second electrode, the first contact electrode directly contacting the light emitting element and the second electrode; and
a second contact electrode on the first electrode and the light emitting element, the second contact electrode directly contacting the first electrode and the light emitting element.

21. The display device of claim 1, wherein the reflective layer covers an outer surface of the insulating layer.

22. The display device of claim 1, wherein the first electrode and the second electrode are spaced apart from each other along the direction parallel to the upper surface of the substrate, and
the plurality of light emitting elements are disposed along the direction parallel to the upper surface of the substrate.

23. The display device of claim 18, wherein the first electrode and the second electrode are disposed on a same plane.

24. The display device of claim 18, wherein the first electrode and the second electrode are spaced apart from each other along the direction parallel to the upper surface of the substrate, and the plurality of light emitting elements are disposed along the direction parallel to the upper surface of the substrate.

\* \* \* \* \*